US012706439B2

(12) United States Patent
Matsumoto et al.

(10) Patent No.: US 12,706,439 B2
(45) Date of Patent: Aug. 11, 2026

(54) VERTICAL CAVITY SURFACE EMITTING LASER, HEAD GIMBAL ASSEMBLY, AND FABRICATION PROCESS

(71) Applicant: Western Digital Technologies, Inc., San Jose, CA (US)

(72) Inventors: Takuya Matsumoto, San Jose, CA (US); Barry C. Stipe, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 903 days.

(21) Appl. No.: 17/591,414

(22) Filed: Feb. 2, 2022

(65) Prior Publication Data

US 2022/0407287 A1 Dec. 22, 2022

Related U.S. Application Data

(60) Provisional application No. 63/211,288, filed on Jun. 16, 2021, provisional application No. 63/211,302, filed on Jun. 16, 2021.

(51) Int. Cl.
*H01S 5/042* (2006.01)
*G11B 5/48* (2006.01)
(Continued)

(52) U.S. Cl.
CPC ........ *H01S 5/04256* (2019.08); *G11B 5/4826* (2013.01); *G11B 5/4866* (2013.01);
(Continued)

(58) Field of Classification Search
CPC ..... H01S 5/04256; H01S 5/183–18397; H01S 5/0201–0205; H01S 5/0425–04257
See application file for complete search history.

(56) References Cited

U.S. PATENT DOCUMENTS 7,627,018 B1 12/2009 Guilfoyle et al.
8,107,326 B1 * 1/2012 Hirano .................. G11B 5/314 369/112.27

(Continued)

FOREIGN PATENT DOCUMENTS

CN 103325389 A 9/2013
CN 104269739 A 1/2015

(Continued)

OTHER PUBLICATIONS

International Search Report and Written Opinion for International Application No. PCT/US2022/016654 dated Jun. 27, 2022.

(Continued)

*Primary Examiner* — Sean P Hagan
(74) *Attorney, Agent, or Firm* — Patterson + Sheridan, LLP

(57) ABSTRACT

Embodiments of the present disclosure generally relate to a vertical cavity surface emitting laser (VCSEL), a head gimbal assembly for mounting a VCSEL, devices incorporating such articles, and to a process for forming a VCSEL. In an embodiment, a process for forming a VCSEL device is provided. The process includes forming a trench in a substrate, forming two laser diode electrodes in the trench, and after forming the two laser diode electrodes, cutting the substrate along the trench to form a VCSEL, the VCSEL comprising a chip for mounting on a slider, the chip having six surfaces, wherein a first surface of the chip is for facing the slider, a second surface of the chip is opposite the first surface, the two laser diode electrodes being positioned in any combination on one or more of a third surface, a fourth surface, a fifth surface, or a sixth surface.

20 Claims, 20 Drawing Sheets

(51) Int. Cl.

| | |
|---|---|
| ***G11B 13/08*** | (2006.01) |
| ***H01S 5/02*** | (2006.01) |
| ***H01S 5/02326*** | (2021.01) |
| ***H01S 5/0233*** | (2021.01) |
| ***H01S 5/0237*** | (2021.01) |
| ***H01S 5/183*** | (2006.01) |
| ***H01S 5/42*** | (2006.01) |
| *G11B 5/00* | (2006.01) |

(52) U.S. Cl.

CPC ............ *G11B 13/08* (2013.01); *H01S 5/0201* (2013.01); *H01S 5/02326* (2021.01); *H01S 5/0233* (2021.01); *H01S 5/0237* (2021.01); *H01S 5/04257* (2019.08); *H01S 5/18394* (2013.01); *H01S 5/423* (2013.01); *G11B 2005/0021* (2013.01); *H01S 5/183* (2013.01)

(56) References Cited

U.S. PATENT DOCUMENTS

| | | | | |
|---|---|---|---|---|
| 8,116,171 | B1 | 2/2012 | Lee | |
| 8,139,448 | B1 | 3/2012 | Hirano et al. | |
| 8,184,507 | B1 | 5/2012 | Hirano et al. | |
| 8,343,364 | B1 | 1/2013 | Gao et al. | |
| 8,804,468 | B2 | 8/2014 | Zhao et al. | |
| 8,908,480 | B1 | 12/2014 | Krichevsky | |
| 9,065,236 | B2 | 6/2015 | Goulakov et al. | |
| 9,196,278 | B1 | 11/2015 | Tatah et al. | |
| 9,286,920 | B1 | 3/2016 | Hu et al. | |
| 10,127,938 | B2 | 11/2018 | Goggin et al. | |
| 10,229,704 | B2 | 3/2019 | Blaber et al. | |
| 10,242,702 | B1 | 3/2019 | Peng | |
| 10,262,683 | B2 | 4/2019 | Staffaroni et al. | |
| 10,403,315 | B2 | 9/2019 | Matsumoto et al. | |
| 10,636,442 | B2 | 4/2020 | Matsumoto et al. | |
| 11,574,647 | B1 | 2/2023 | Yu et al. | |
| 11,798,582 | B2 | 10/2023 | Puri et al. | |
| 11,894,031 | B1 | 2/2024 | Jin et al. | |
| 12,119,032 | B1 | 10/2024 | Matsumoto et al. | |
| 2003/0169796 | A1* | 9/2003 | Nakamura | H01S 5/04257 372/46.01 |
| 2005/0167830 | A1* | 8/2005 | Chang | H05K 3/4007 257/737 |
| 2005/0183960 | A1 | 8/2005 | Andideh et al. | |
| 2006/0220192 | A1* | 10/2006 | Kurachi | H01L 21/02378 257/E21.267 |
| 2006/0251137 | A1 | 11/2006 | Sung et al. | |
| 2007/0164279 | A1* | 7/2007 | Lin | H10P 74/273 257/E23.021 |
| 2007/0201530 | A1* | 8/2007 | Rhee | H01S 5/02345 372/66 |
| 2008/0054457 | A1* | 3/2008 | Lin | H01L 24/29 257/737 |
| 2009/0154514 | A1 | 6/2009 | Oh et al. | |
| 2009/0225636 | A1 | 9/2009 | Hirano et al. | |
| 2010/0085664 | A1 | 4/2010 | Hirata et al. | |
| 2011/0135318 | A1 | 6/2011 | Takeda et al. | |
| 2011/0216635 | A1 | 9/2011 | Matsumoto | |
| 2012/0113770 | A1 | 5/2012 | Stipe | |
| 2012/0230361 | A1 | 9/2012 | Adachi et al. | |
| 2013/0286799 | A1 | 10/2013 | Zhu et al. | |
| 2014/0098652 | A1 | 4/2014 | Tomiyama et al. | |
| 2016/0284370 | A1 | 9/2016 | Takayama et al. | |
| 2016/0300592 | A1 | 10/2016 | Kawakami et al. | |
| 2017/0256277 | A1 | 9/2017 | Peng | |
| 2018/0335575 | A1 | 11/2018 | Gudeman | |
| 2020/0091679 | A1* | 3/2020 | Furuyama | H01S 5/04256 |
| 2020/0144792 | A1 | 5/2020 | Dummer | |
| 2021/0201942 | A1 | 7/2021 | Zhao et al. | |
| 2021/0398556 | A1 | 12/2021 | Stipe et al. | |
| 2021/0398557 | A1 | 12/2021 | Stipe et al. | |
| 2022/0189507 | A1 | 6/2022 | Stipe et al. | |
| 2022/0407292 | A1 | 12/2022 | Matsumoto | |
| 2024/0296866 | A1 | 9/2024 | Xu et al. | |

FOREIGN PATENT DOCUMENTS

| | | | |
|---|---|---|---|
| CN | 105144511 | A | 12/2015 |
| CN | 110679049 | A | 1/2020 |
| CN | 116917988 | A | 10/2023 |
| CN | 116982227 | A | 10/2023 |
| JP | H0669605 | A | 3/1994 |
| JP | 2000101020 | A | 4/2000 |
| JP | 200322967 | A | 8/2003 |
| JP | 2008152869 | A | 7/2008 |
| JP | 2011096857 | A | 5/2011 |
| JP | 2011124314 | A | 6/2011 |
| JP | 2013098404 | A | 5/2013 |
| JP | 2020046511 | A | 3/2020 |

OTHER PUBLICATIONS

International Search Report and Written Opinion for International Application No. PCT/US2022/019987 dated Aug. 9, 2022.

U.S. Appl. No. 18/229,779, filed Aug. 3, 2023.

International Search Report and Written Opinion for Application No. PCT/US2024/012257 dated May 17, 2024.

Datta, Anurup et al., "Improved Near-Field Transducer Design for Heat-Assisted Magnetic Recording", IEEE Transactions On Magnetics, vol. 52, No. 12, Dec. 2016, pp. 1-6.

Zhou, Nan et al., "Plasmonic near-field transducer for heat-assisted magnetic recording", Science Wise Publishing & De Gruyter, 2014, pp. 141-155.

Challener, W. A. et al., "Heat-assisted magnetic recording by a near-field transducer with efficient optical energy transfer", Nature Photonics, Mar. 2009, pp. 220-224.

Kryder, Mark H. et al., "Heat Assisted Magnetic Recording", Proceedings of the IEEE, vol. 96, No. 11, Nov. 2008, pp. 1-27.

Du, Tianxiang et al., "A Novel Design of Capacitive Plasmonic Near Field Transducer", Applied Physics, Jun. 2024, pp. 1-4.

* cited by examiner 901
900a 905
901
900b 910
905
901
900c 915
910
905
915
901
900d 915
920
905
915
910
901
900e 920
905
910
901
900f 925
920
905
910
901
900g 925
920
905
910
901
900h 910
920
905
901
900i 1100a
1101

1100b
1105
1101

1100c
1105
1110
1101

1100d
1105
1115
1110
1101

1100e
1105
1120
1115
1110
1101

1100f
1120
1105
1110
1101

1100g
1105
1120
1110
1101

1100h
1120
1105
1110
1101

1200a
1201

1200b
1205
1201

1200c
1210
1201
1205

1200d
1215
1201
1210
1205

1200e
1215
1220
1201
1210
1205

1200f
1220
1201
1210
1205

1200g
1220
1210
1201
1205

1200h
1220
1210
1205
1201

1300a
1301

1300b
1301
1305

1300c
1310
1307
1301
1305

1300d
1315
1310
1301
1305

1300e
1315
1310
1301
1320
1305

1300f
1320
1310
1301
1305

1300g
1320
1310
1301
1305

1300h
1320
1305
1310
1301

1500a
1501

1500b
1505a
1505b
1501

1500c
1505a
1510
1507
1501
1505b 1500d
1515
1510
1501
1505a 1500e
1520
1515
1510
1501
1505a
1505b 1500f
1505a
1520
1510
1501
1505b 1500g
1505a
1520
1510
1501
1505b 1500h
1510
1520
1505a
1501
1505b

VERTICAL CAVITY SURFACE EMITTING LASER, HEAD GIMBAL ASSEMBLY, AND FABRICATION PROCESS

CROSS-REFERENCES TO RELATED APPLICATIONS

This application claims priority to U.S. Provisional Application No. 63/211,288, filed Jun. 16, 2021 and U.S. Provisional Application No. 63/211,302, filed Jun. 16, 2021, each of which are incorporated herein by reference in their entirety.

BACKGROUND OF THE DISCLOSURE

Field of the Disclosure

Embodiments of the present disclosure generally relate to a vertical cavity surface emitting laser, a head gimbal assembly for mounting a vertical cavity surface emitting laser, devices incorporating such articles, and to a process for forming a vertical cavity surface emitting laser.

Description of the Related Art

Heat-assisted magnetic recording (HAMR) is a type of energy-assisted recording technology to improve the recording density of a magnetic recording medium. In HAMR, a laser source is located next to or near the write element in order to produce heat, such as a laser source exciting a near-field transducer (NFT) to produce heat at a write location of a magnetic recording medium. One approach to providing heat in HAMR involves the use of a vertical cavity surface emitting lasers (VCSEL) to direct laser light through the magnetic recording head to the magnetic media. Here, the VCSEL is mounted to a top surface of a slider, and one or more laser beams are emitted from the bottom surface of the VCSEL and directed to a corresponding number of waveguide structures within the HAMR head. The waveguide structures feed into a multimode interference (MMI) device that then directs the laser into a waveguide for focusing on a near field transducer (NFT).

Although conventional VCSELs have reduced costs relative to other lasers, e.g., edge emitting laser diodes, and have no mode hopping, conventional VCSELs do not permit active alignment to maximize the coupling between the waveguide and the laser. This lack of active alignment is a result of the laser diode electrodes of VCSELs being connected to, or facing, the top surface of the slider. Further, since the laser diode electrodes of the VCSEL are connected to the slider, complicated back-side patterning processes are typically employed during slider fabrication.

There is a need for new and improved VCSELs, head gimbal assemblies (HGAs) for mounting VCSELs, and devices incorporating such articles.

SUMMARY OF THE DISCLOSURE

Embodiments of the present disclosure generally relate to a vertical cavity surface emitting laser (VCSEL), a head gimbal assembly for mounting a VCSEL, devices incorporating such articles, and to a process for forming a VCSEL.

In an embodiment, a process for forming a vertical cavity surface emitting laser (VCSEL) device is provided. The process includes forming a trench in a substrate, and forming two laser diode electrodes in the trench. The process further includes, after forming the two laser diode electrodes, cutting the substrate along the trench to form a VCSEL, the VCSEL comprising a chip for mounting on a slider, the chip having six surfaces, wherein a first surface of the chip is for facing the slider; a second surface of the chip is opposite the first surface; and the two laser diode electrodes being positioned in any combination on one or more of a third surface, a fourth surface, a fifth surface, or a sixth surface.

In another embodiment, a process for forming a vertical cavity surface emitting laser (VCSEL) device is provided. The process includes etching one or more trenches in a substrate and forming two laser diode electrodes in the one or more trenches. The process further includes, after forming the two laser diode electrodes, cutting the substrate along the one or more trenches to form a VCSEL, the VCSEL comprising a chip for mounting on a slider, the chip having six surfaces, wherein a first surface of the chip is for facing the slider; a second surface of the chip is opposite the first surface; and the two laser diode electrodes being positioned in any combination on one or more of a third surface, a fourth surface, a fifth surface, or a sixth surface.

In another embodiment, a process for forming a vertical cavity surface emitting laser (VCSEL) device is provided. The process includes etching one or more trenches formed therein in a substrate; depositing a seed layer comprising a conductive material on the substrate; and patterning a photoresist material on the seed layer. The process further includes depositing a metal containing material on at least a portion of the seed layer that is free of the photoresist material, and removing the photoresist material and a portion of the seed layer from the substrate. The process further includes cutting the substrate along the one or more trenches of the substrate after removing the photoresist material and the portion of the seed layer to form a VCSEL, the VCSEL comprising: a chip for mounting on a slider, the chip having six surfaces, wherein: a first surface of the chip is for facing the slider; a second surface of the chip is opposite the first surface; and two laser diode electrodes being positioned in any combination on one or more of a third surface, a fourth surface, a fifth surface, or a sixth surface, the two laser diode electrodes formed from the seed layer and the metal containing material.

In an embodiment, a vertical cavity surface emitting laser (VCSEL) device is provided. The VCSEL device includes a chip for mounting on a slider and two laser diode electrodes. The chip has six surfaces, wherein a first surface of the chip is for facing the slider, a second surface of the chip is opposite the first surface, and the two laser diode electrodes are positioned in any combination on one or more of a third surface, a fourth surface, a fifth surface, or a sixth surface of the chip.

In another embodiment, a magnetic recording head assembly is provided. The magnetic recording head assembly includes a head assembly and a vertical cavity surface emitting laser (VCSEL) device. The VCSEL device includes a chip for mounting on a slider and two laser diode electrodes. The chip has six surfaces, wherein a first surface of the chip is for facing the slider, a second surface of the chip is opposite the first surface, and the two laser diode electrodes are positioned in any combination on one or more of a third surface, a fourth surface, a fifth surface, or a sixth surface of the chip.

In another embodiment, a vertical cavity surface emitting laser (VCSEL) device is provided. The VCSEL device includes a chip for mounting on a slider and two laser diode electrodes. The chip has six surfaces, wherein a first surface of the chip is for facing the slider, a second surface of the chip is opposite the first surface, and the two laser diode electrodes are positioned in any combination on one or more of a third surface, a fourth surface, a fifth surface, or a sixth surface of the chip. Each laser diode electrode of the two laser diode electrodes are, individually, positioned in a trench formed in the chip.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 17A-17H are a process flow diagram showing selected operations of an example process for forming an electrode on a side surface of a VCSEL according to at least one embodiment of the present disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure generally relate to a vertical cavity surface emitting laser (VCSEL), a head-gimbal assembly for mounting VCSEL, and to devices incorporating such articles, e.g., magnetic media drives. Processes for fabricating VCSELs described herein are also described.

The inventors have found new and improved VCSELs that, unlike conventional VCSELs, enable active alignment by, e.g., placing the laser diode electrodes of the VCSEL on a different VCSEL surface than that surface connected to the slider. Briefly, and in some embodiments, the VCSELs described herein include a multi-surfaced chip for mounting on a slider. A first surface of the chip is for facing the slider, a second surface of the chip is opposite the first surface, and side surfaces to which two laser diode electrodes can be positioned on, or coupled to. Because the laser diode electrodes are coupled to, or positioned on, the side surfaces of the VCSEL, active alignment during use of the VCSEL and devices incorporating VCSELs can be achieved. In addition, the VCSELs described herein enable simpler manufacturing processes for the slider and HGAs incorporating the VCSELs, thereby reducing costs.

Figure 1:
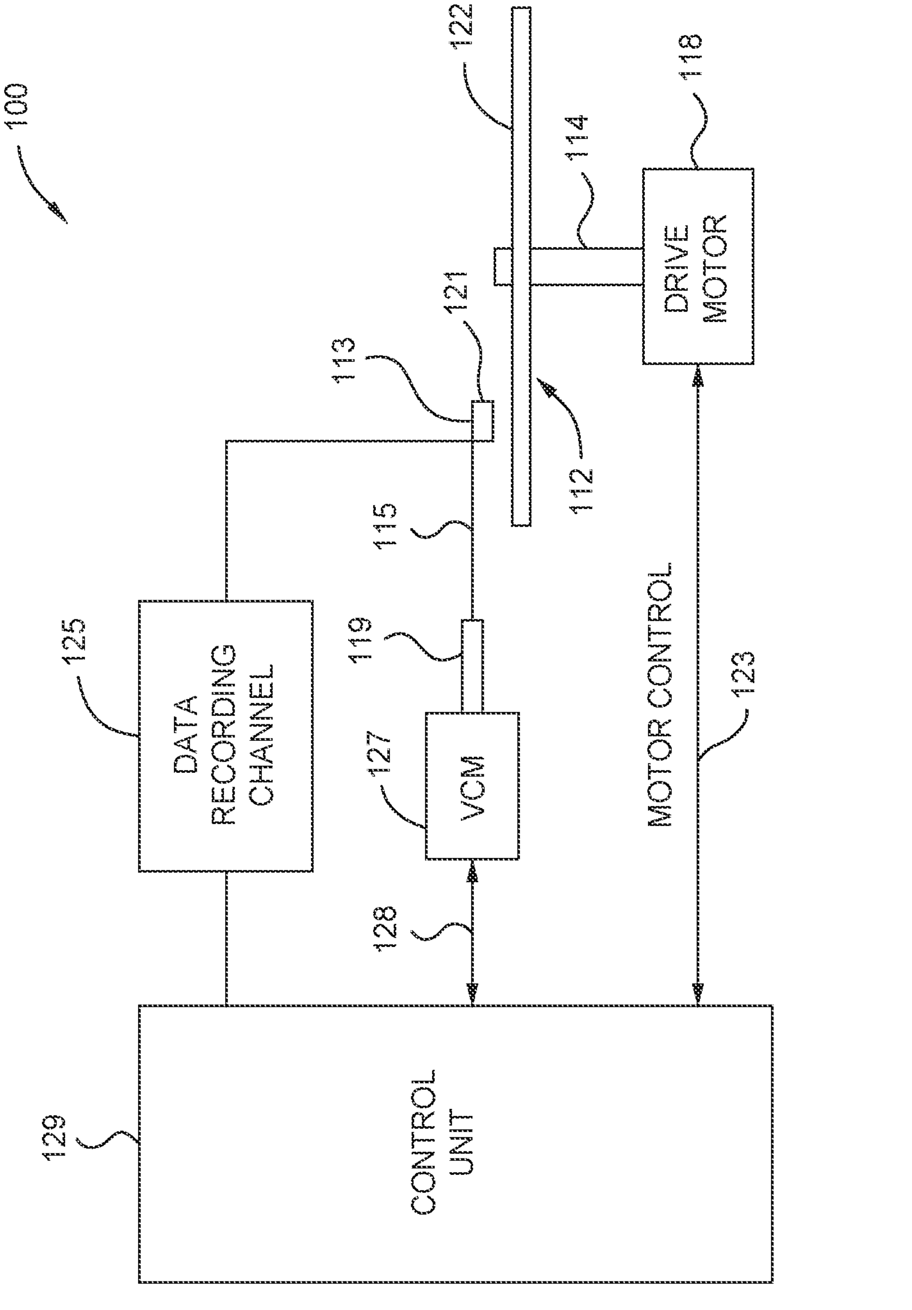
FIG. 1 is a schematic illustration of an example magnetic media drive including a HAMR magnetic write head according to at least one embodiment of the present disclosure.

FIG. 1 is a schematic illustration of certain embodiments of a magnetic media drive including a HAMR magnetic write head. Such magnetic media drive may be a single drive/device or include multiple drives/devices. For the ease of illustration, a single disk drive 100 is shown according to an embodiment. The disk drive 100 includes at least one rotatable magnetic recording medium 112 (oftentimes referred to as magnetic disk 112) supported on a spindle 114 and rotatable by a drive motor 118. The magnetic recording on each magnetic disk 112 is in the form of any suitable patterns of data tracks, such as annular patterns of concentric data tracks (not shown) on the magnetic disk 112.

At least one slider 113 is positioned near the magnetic disk 112. Each slider 113 supports a head assembly 121 (e.g., a reading/recording head assembly) including one or more read heads and one or more write heads such as a HAMR write head. In operation, as the magnetic disk 112 rotates, the slider 113 moves radially in and out over the disk surface 122 so that the head assembly 121 may access different tracks of the magnetic disk 112 where desired data are written. Each slider 113 is attached to an actuator arm 119 by way of a suspension 115. The suspension 115 provides a slight spring force which biases the slider 113 toward the disk surface 122. Each actuator arm 119 is attached to an actuator 127. The actuator 127, as shown in FIG. 1, may be a voice coil motor (VCM). The VCM includes a coil movable within a fixed magnetic field, the direction and speed of the coil movements being controlled by the motor current signals supplied by control unit 129.

During operation of the disk drive 100, the rotation of the magnetic disk 112 generates an air bearing between the slider 113 and the disk surface 122 which exerts an upward force or lift on the slider 113. The air bearing thus counter-balances the slight spring force of suspension 115 and supports slider 113 off and slightly above the disk surface 122 by a small, substantially constant spacing during normal operation.

The various components of the disk drive 100 are controlled in operation by control signals generated by control unit 129, such as access control signals and internal clock signals. Typically, the control unit 129 includes logic control circuits, storage means, and a microprocessor. The control unit 129 generates control signals to control various system operations such as drive motor control signals on line 123 and head position and seek control signals on line 128. The control signals on line 128 provide the desired current profiles to optimally move and position the slider 113 to the desired data track on magnetic disk 112. Write and read signals are communicated to and from the head assembly 121 by way of recording channel 125. Certain embodiments of a magnetic media drive of FIG. 1 may further include a plurality of media, or disks, a plurality of actuators, and/or a plurality number of sliders.

Figure 2:
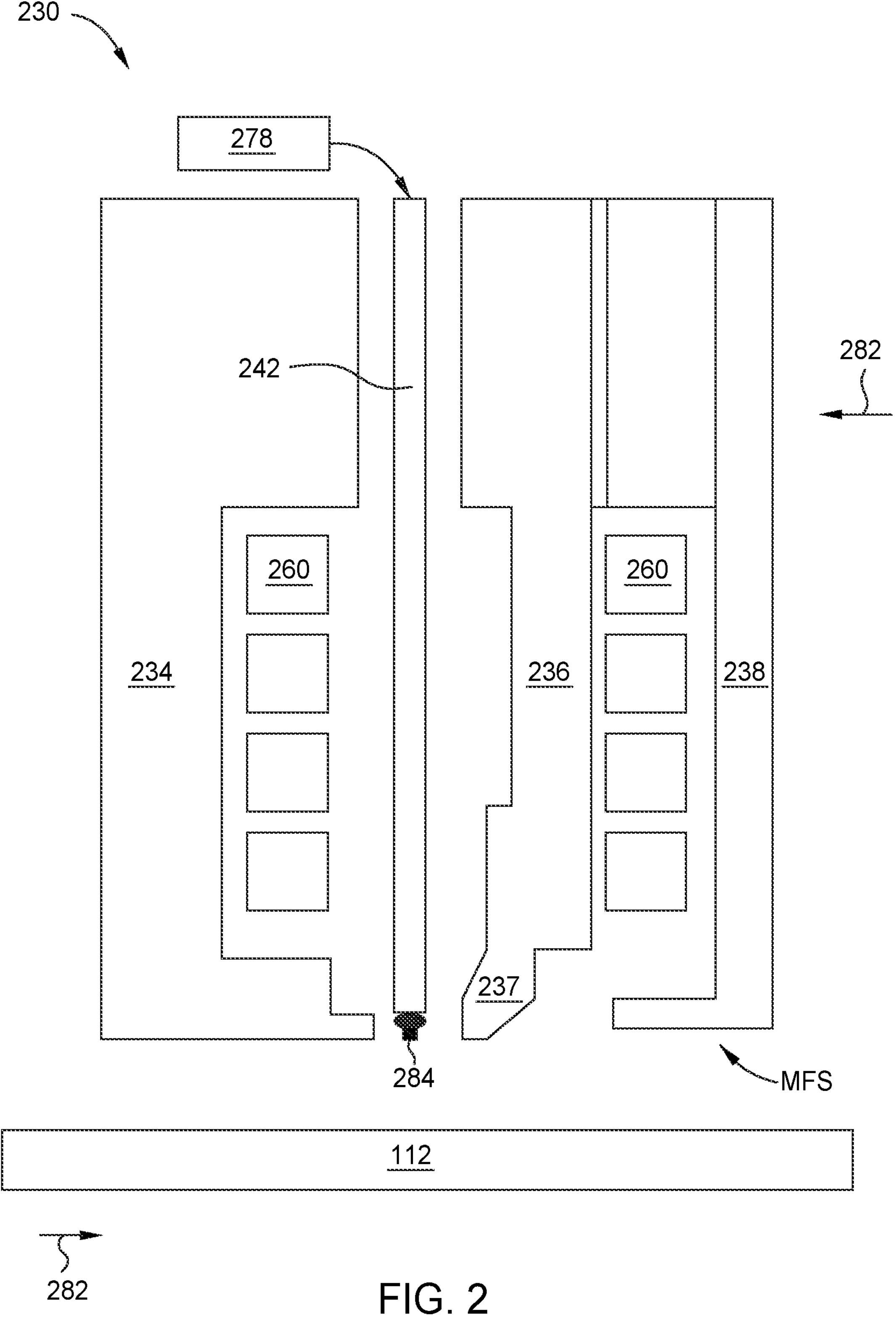
FIG. 2 is a schematic illustration of certain embodiments of a cross-sectional side view of an example HAMR write head facing a magnetic disk according to at least one embodiment of the present disclosure.

FIG. 2 is a schematic illustration of certain embodiments of a cross-sectional side view of a HAMR write head 230 facing a magnetic disk 112. The HAMR write head 230 can correspond to part of the reading/recording head assembly 121 described in FIG. 1 or a recording head used in other magnetic media drives. The HAMR write head 230 includes a media facing surface (MFS), such as an air bearing surface (ABS) or a gas bearing surface (GBS), facing the magnetic disk 112. As shown in FIG. 2, the magnetic disk 112 and the HAMR write head 230 relatively moves in the direction indicated by the arrows 282 (need to change direction).

The HAMR write head 230 includes a main pole 236 disposed between a leading shield 234 and a trailing shield 238. The main pole 236 can include a main pole tip 237 at the MFS. The main pole tip 237 can include or not include a leading taper and/or a trailing taper. A coil 260 around the main pole 236 excites the main pole tip 237 to produce a writing magnetic field for affecting a magnetic medium of the magnetic disk 112. The magnetic disk 112 can be rotatable. In some embodiments, the coil 260 is a helical structure or one or more sets of pancake structures. The leading shield 234 and/or the trailing shield 238 can act as the return pole for the main pole 236. The magnetic disk 112 is positioned adjacent to or under the HAMR write head 230. A magnetic field produced by current in the coil 260 is used to control the direction of magnetization of bits in the magnetic disk 112.

The HAMR write head 230 includes a structure for heating the magnetic disk 112 in a location proximate to where the main pole tip 237 applies the magnetic write field to the storage media. A waveguide 242 is positioned between the main pole 236 and the leading shield 234. The waveguide 242 can include a core layer and a cladding layer surrounding the core layer. The waveguide 242 conducts light from a light source 278 of electromagnetic radiation, which can be, for example, ultraviolet, infrared, or visible light. The light source 278 can be, for example, a laser diode, or other suitable laser light source for directing a light beam toward the waveguide 242. Various suitable techniques for coupling the light source 278 into the waveguide 242 can be used. For example, the light source 278 can work in combination with an optical fiber and external optics for directing a light beam to the waveguide 242. Alternatively, the light source 278 can be mounted on the waveguide 242 and the light beam can be directly coupled into the waveguide 242 without the need for external optical configurations. Once the light beam is coupled into the waveguide 242, the light propagates through the waveguide 242 and heats a portion of the media as the media moves relative to the HAMR write head 230, as shown by arrows 282.

The HAMR write head 230 includes a near-field transducer (NFT) 284 to concentrate the heat in the vicinity of the end of the waveguide 242. The NFT 284 is positioned in or adjacent to the waveguide 242 near or at the MFS. Light from the waveguide 242 is absorbed by the NFT 284 and excites surface plasmons which travel along the outside of the NFT 284 towards the MFS concentrating electric charge at the tip of the NFT 284 which in turn capacitively couples to the magnetic disk and heats a precise area of the magnetic disk 112 by Joule heating. One possible design for the NFT 284 of the HAMR write head is a lollipop design with a disk portion and a peg extending between the disk and the MFS. The NFT 284 can be placed in close proximity to the main pole 236. The NFT 284 can be relatively thermally isolated and can absorb a significant portion of the laser power while it is in resonance.

Various embodiments of the VCSELs and HGAs described below can be used with the magnetic media drive and HAMR write head discussed above.

Example VCSELs and HGAs

Embodiments of the present disclosure also relate to VCSELs and HGAs incorporating VCSELs. VCSELs have a number of significant advantages, relative to edge emitting laser diodes (EELDs), for use as the light source in HAMR. EELDs used today are typically mounted to a sub-mount because it is difficult to bond the edge-emitting facet face of the laser directly to the top of the slider. This sub-mount is then bonded to the slider. Conventional VCSELs, in contrast, have bonding electrodes on the surface-emitting face which match corresponding electrodes on the top surface of the slider. These electrodes can be bonded together by laser-assisted solder reflow and can also serve as electrical connections for energizing the laser. By eliminating the need for a sub-mount, the light source cost can be significantly reduced.

Although conventional VCSELs have reduced costs relative to other lasers, e.g., edge emitting laser diodes (EELDs), and have no mode hopping, conventional VCSELs do not permit active alignment. This is a result of the laser diode electrodes of VCSELs being connected to, or facing, the top surface of the slider. Embodiments described herein, unlike state-of-the-art VCSELs, enable active alignment.

Figure 3A:
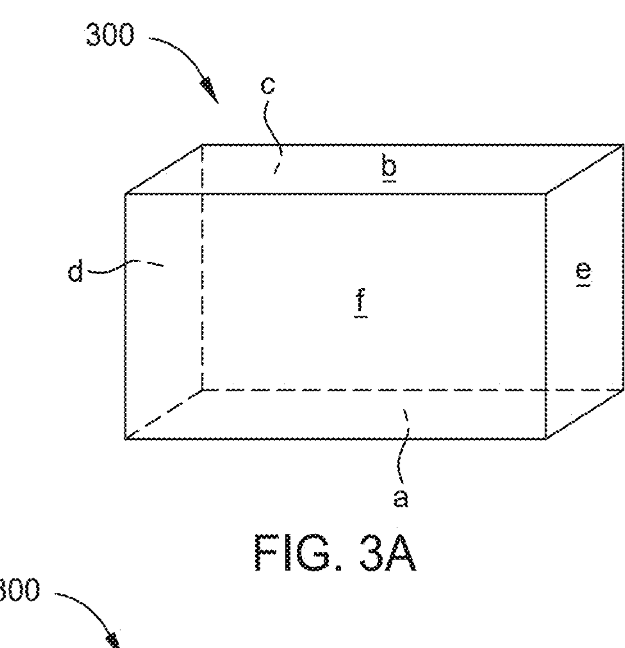
FIG. 3A shows surfaces of a VCSEL, without laser diode electrodes, according to at least one embodiment of the present disclosure.

FIG. 3A shows surfaces of a VCSEL 300 chip according to some embodiments. Although the VCSEL 300 is shown having a rectangular prism morphology, other suitable morphologies or shapes, such as cubic, are contemplated. The VCSEL 300 has a first surface a (e.g., a bottom surface) which can be coupled, directly or indirectly, to the slider and a second surface b (e.g., a top surface) opposite the first surface a. One or more of the other surfaces—a third surface c (e.g., a back surface), a fourth surface d (e.g., a side surface), a fifth surface e (e.g., a side surface), and a sixth surface f (e.g., a front surface)—are utilized for positioning or coupling one or more laser diode electrodes (not shown) thereon, in any combination. Third surface c, fourth surface d, fifth surface e, and sixth surface f, are side surfaces of the VCSEL 300. The number of laser diode electrodes positioned on, or coupled to, one or more side surfaces of the VCSEL can be any suitable number, such as 1, 2, 3, 4, 5, or 6 laser diode electrodes, such as 1 or 2 laser diode electrodes.

In some embodiments, the two laser diode electrodes are positioned on, or coupled to, the same side surface. For example, two laser diode electrodes can be positioned on, or coupled to, the third surface c; two laser diode electrodes can be positioned on, or coupled to, the fourth surface d; two laser diode electrodes can be positioned on, or coupled to, the fifth surface e; or two laser diode electrodes can be positioned on, or coupled to, the sixth surface f.

In some embodiments, one laser diode electrode is positioned on, or coupled to, to one surface of the VCSEL, and another laser diode electrode is positioned on, or coupled to, a different surface of the VCSEL, in any combination. For example, and as non-limiting illustrations, one laser diode electrode can be positioned on, or coupled to, the third surface c and the other laser diode electrode can be positioned on, or coupled to, the fourth surface d; or one laser diode electrode is positioned on, or coupled to, the third surface c and the other laser diode electrode is positioned on, or coupled to, the fifth surface e. Other orientations for coupling the laser diode electrodes to the VCSEL 300 are contemplated.

The VCSELs described herein can have various dimensions. For example, and in some embodiments, the bottom surface (e.g., first surface a) and the top surface (e.g., second surface b) of the VCSEL has a height of about 75 μm to about 150 μm and/or a length of about 100 μm to about 250 μm. A side surface of the VCSEL can have the same or similar dimensions. A width of the bottom surface (e.g., first surface a) and the top surface (e.g., second surface b) can be about 100 μm to about 250 μm, such as about 150 μm to about 200 μm, and/or a length of bottom surface (e.g., first surface a) and the top surface (e.g., second surface b) can be about 100 μm to about 250 μm, such as about 150 μm to about 200 μm. Smaller or larger dimensions for the VCSELs are contemplated. The dimensions of the various surfaces can be the same or different.

Figure 3B:
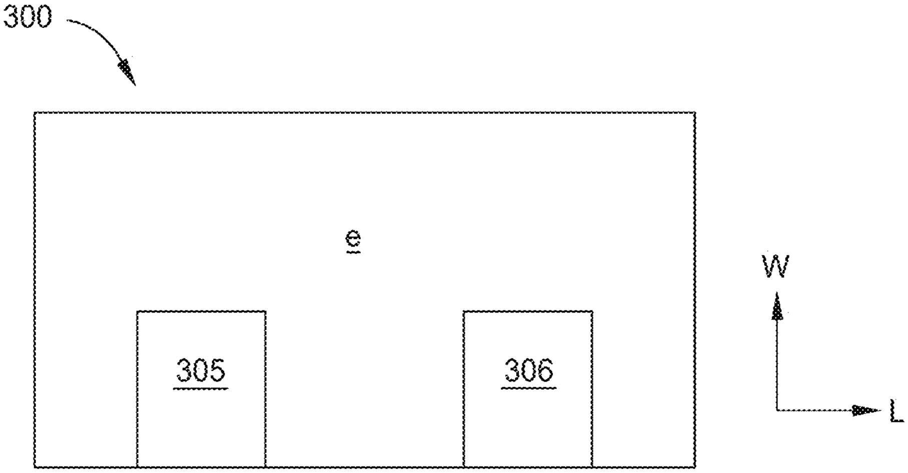
FIG. 3B shows a side view of an example VCSEL, having laser diode electrodes, coupled thereto according to at least one embodiment of the present disclosure.
Figure 3C:
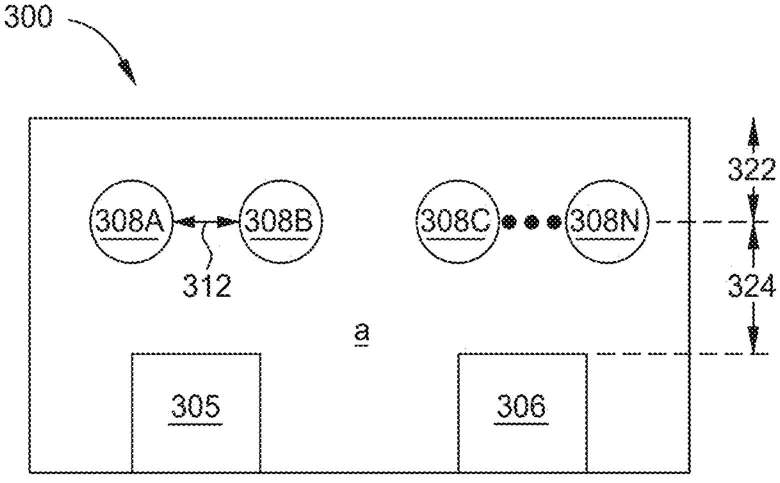
FIG. 3C shows a bottom view of the example VCSEL, where the laser diode electrodes extend to the bottom surface, according to at least one embodiment of the present disclosure.

FIGS. 3B and 3C are schematic illustrations of a side view and a bottom view of the VCSEL 300, respectively, according to some embodiments. The VCSEL 300 has one or more laser diode electrodes on a side surface as described above. In the non-limiting illustration shown in FIG. 3B, the VCSEL 300 has two laser diode electrodes 305, 306 positioned on, or coupled to, side surface e.

As shown in FIG. 3C, a plurality of laser apertures **308*a*-308*n* are disposed on the bottom surface a of the VCSEL 300. It is contemplated that a single laser aperture can be utilized instead of the plurality of laser apertures. The number of laser apertures 308*a*-308*n* matches the number of spot size converters of the slider. Each laser aperture 308*a*-308*n* can be spaced by a distance 312 of about 1 μm to about 20 μm, such as from about 2 μm to about 10 μm, from the adjacent laser aperture 308*a*-308*n*. Longer or shorter distances 312 are contemplated. The laser apertures 308*a*-308*n* can be aligned about a center line and each of the plurality laser apertures 308*a*-308*n* can be aligned to a corresponding input laser. The laser apertures 308*a*-308*n* can also be aligned with a corresponding laser aperture of the cavity (not shown). As shown in FIG. 3C, the two laser diode electrodes 305, 306 extend from the side surface e to the bottom surface a of the VCSEL 300**.

Each of the laser apertures **308*a*-308*n* can, independently, have a diameter of about 1.5 μm to about 8 μm and can be on a 2 μm to 10 μm pitch, though larger or smaller diameters and pitches are contemplated. The center of the laser apertures 308*a*-308*n* can be spaced from the side by a distance 322 of about 35 μm to about 50 μm, though a larger or smaller distance 322 is contemplated. The center of the laser apertures 308*a*-308*n* can be spaced from the laser diode electrodes 305, 306 by a distance 324 of about 75 μm to about 90 μm, though a larger or smaller distance 324** is contemplated.

Figure 4A:
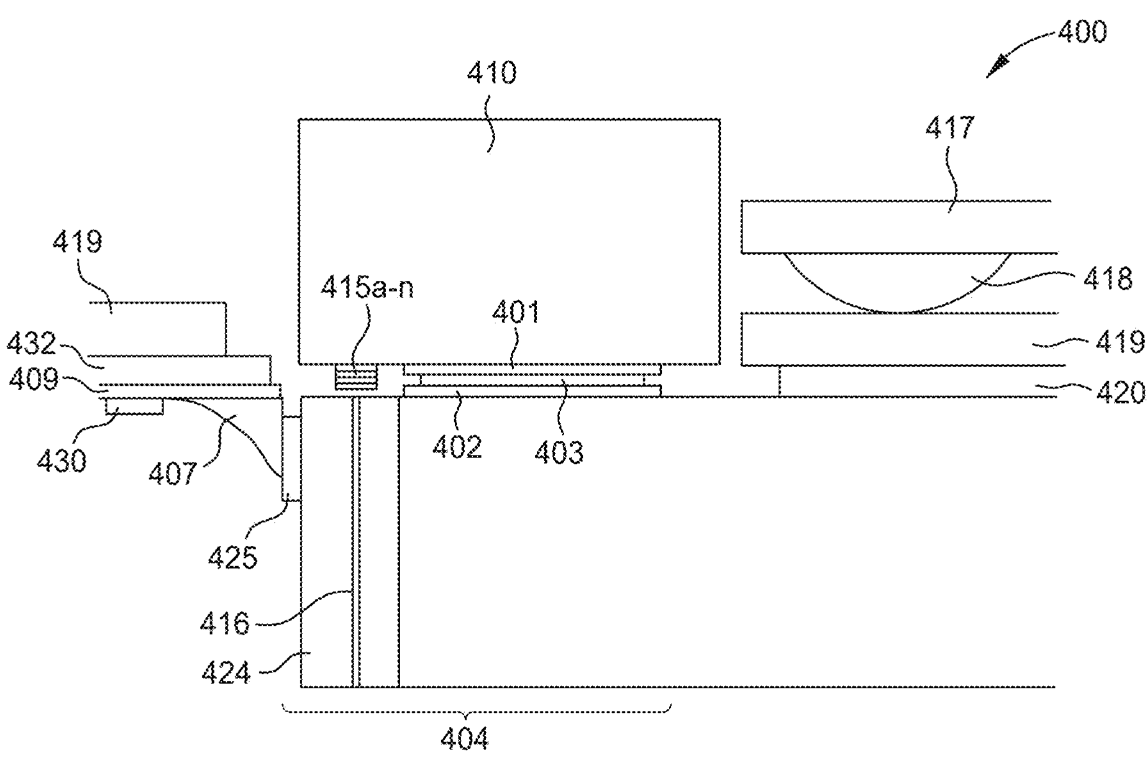
FIG. 4A is a schematic illustration of a cross-sectional view (down-track direction) of an example slider having an example VCSEL mounted thereto according to at least one embodiment of the present disclosure.
Figure 4B:
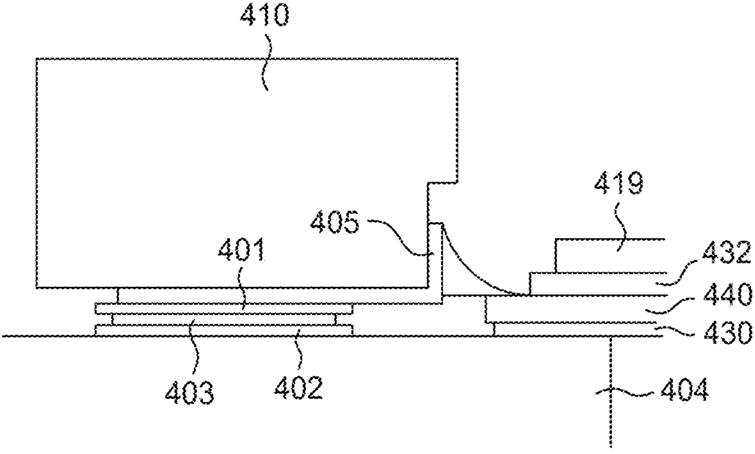
FIG. 4B is a cross-sectional view (cross-track direction) of the example VCSEL shown in FIG. 4A according to at least one embodiment of the present disclosure.
Figures 6A, 6B:
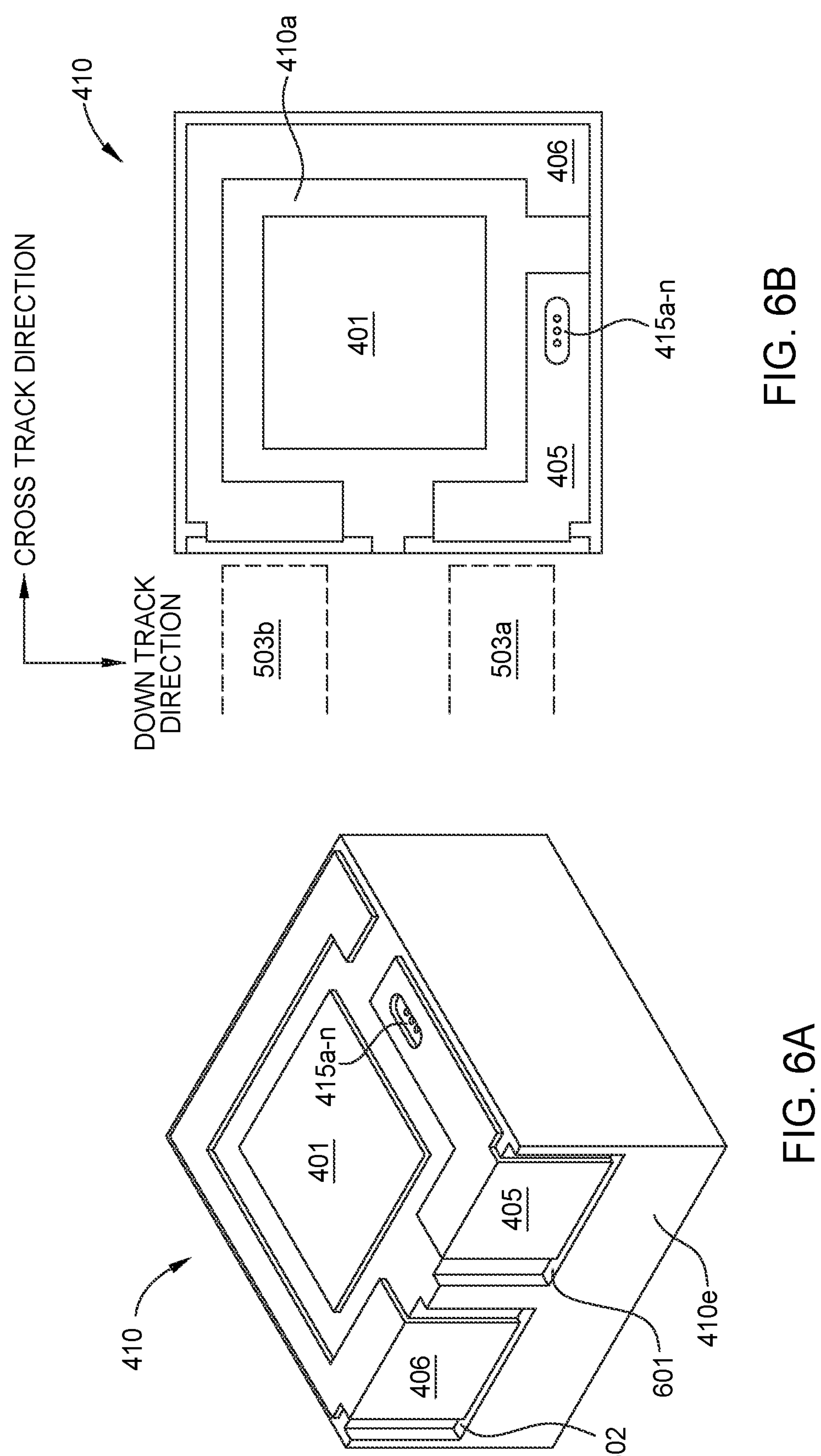
FIG. 6A is a schematic illustration of a perspective view of an example slider having an example VCSEL mounted thereto according to at least one embodiment of the present disclosure.
FIG. 6B is a bottom view of the example VCSEL shown in FIG. 6A according to at least one embodiment of the present disclosure.

FIGS. 4A and 4B are schematic illustrations 400 of a cross-sectional view (down-track direction and cross-track direction, respectively) of a slider 404 having a VCSEL 410 chip mounted thereto according to some embodiments. The schematic illustrations shown in FIGS. 4A and 4B can be a portion of an HGA. For clarity, certain features are not labeled in FIG. 4B. A laser diode electrode 405 is coupled to, or positioned on, a side surface of the VCSEL 410. Although only one laser diode electrode 405 is shown coupled to the side surface **410*e*, another laser diode electrode (e.g., laser diode electrode 406 shown in FIG. 6A) is coupled to the same side surface 410*e* of the VCSEL 410. The laser diode electrodes 405, 406 extend from the side surface 410*e* of the VCSEL 410 to the bottom surface 410***a* of the VCSEL 410 as shown in FIGS. 6A and 6B.

Referring to FIG. 4A, the VCSEL 410 is mounted to the slider 404 via a pad 401, a pad 402, and a soldering material 403. The pad 401 and the pad 402 can each, independently, be a metal containing layer. The slider 404 includes a substrate, e.g., an AlTiC substrate, and a layer 424, e.g., an alumina containing layer. The pad 401 is coupled to the bottom surface 410*a* of the VCSEL 410 and the pad 402 is coupled to a top surface 404*a* of the slider 404. The pad 401, the pad 402, and the soldering material 403 can collectively form a contact after soldering. A conductive adhesive can be used in addition to, or instead of, the soldering material 403.

The VCSEL 410 includes one or more cavities 415*a-n* through which one or more laser beams exit the VCSEL 410 and enter a single output waveguide 416 positioned within the layer 424. Any suitable number of cavities can be used such as from about 1 to about 16, such as from about 3 to about 12. Higher or lower number of cavities are contemplated. Each of the one or more laser beams emitted by the VCSEL 410 can operate at the same frequency and can be phase coherent. Each laser of the one or more laser beams emitted by the VCSEL 410 can have a power level from about 0.5 mW to about 20 mW, such as from about 1 mW to about 10 mW, such as from about 2 mW to about 8 mW, such as from about 4 mW to about 6 mW. Higher or lower power levels are contemplated. Although not shown, a multimode interference (MMI) device can be used and be disposed within the slider 404. When used, the MMI device combines the laser light fed from the cavities 415*a*-415*n* and emits a single laser through a single output waveguide 416. The single output waveguide 416 can emit laser light from the MMI device that includes the combined power of the plurality of input lasers accepted by the MMI device. The single output mode can be utilized to concentrate the optical power and couple to the NFT.

A slider pad 425 is coupled to a surface of the layer 424 of the slider 404. The slider pad 425 is coupled to a multilayer structure that includes a first polyimide layer 430, an electrode 409, a second polyimide layer 432, and a flexure 419. Coupling of the slider pad 425 to the multilayer structure can be accomplished by soldering material. A conductive adhesive can be used in addition to, or instead of, the soldering material 407.

A suspension (a portion of which is shown) which supports the slider 404 is disposed on the same surface of the slider 404 as the pad 402, e.g., top surface 404*a*. The suspension includes a flexure 419 and a load beam 417. The load beam is the main body of the suspension. The flexure 419 holds the slider 404, and the flexure 419 is attached to the load beam 417. In operation, the load beam 417 can push the slider 404 toward a disk with a dimple 418. Between the flexure 419 and the slider 404 is disposed a polyimide layer 420 that includes wires. The polyimide layer 420 that includes wires is for applying current or voltage to the components in the slider (magnetic head, heater for spacing control etc.) or for sending signals from the sensors (reader, contact sensor, thermal sensor) to the preamp.

Figure 5:
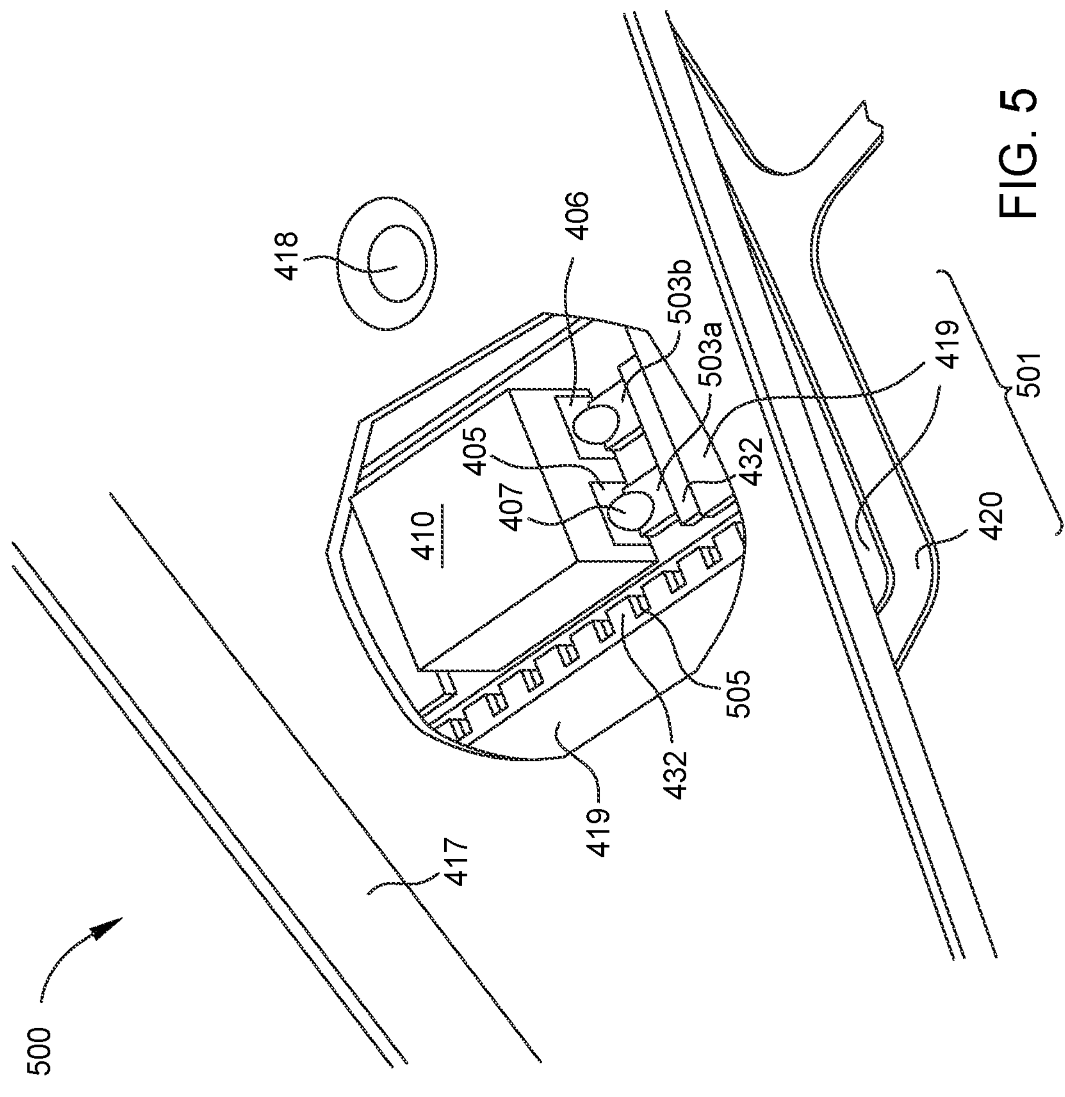
FIG. 5 is a perspective view of a portion of an example heat assisted magnetic recording head gimbal assembly according to at least one embodiment of the present disclosure.

FIG. 5 is a perspective view of a portion of a heat assisted magnetic recording head gimbal assembly 500. Although the head gimbal assembly 500 includes the VCSEL structure shown in FIGS. 4A and 4B, it is contemplated that the head gimbal assembly can be used with other VCSEL structures shown in described herein. The head gimbal assembly 500 includes a suspension 501 that includes the flexure 419 and the load beam 417, discussed above. The polyimide layer 420 that includes wires is positioned between the flexure 419 and the slider 404. The VCSEL 410 mounted on slider 404 is positioned next to the polyimide layer 420. The flexure 419 includes electrodes 503*a*, 503*b*, 505. In the configuration shown in FIG. 5, the VCSEL is positioned on the slider such that laser diode electrode 405 and laser diode electrode 406 can be coupled to electrodes 503*a* and 503*b* respectively. The electrodes 503*a*, 503*b* serve to apply a current to the laser diode electrodes. Electrode 505 is coupled to the slider pad and serves to apply a current or voltage to the components in the slider (e.g. magnetic head, heater for spacing control etc.) or for sending signals from the sensors (reader, contact sensor, thermal sensor) to a preamp. Electrode 440 shown in FIG. 4B corresponds to electrode 503*a*, while electrode 409 in FIG. 4A corresponds to electrode 505.

Figure 6D:
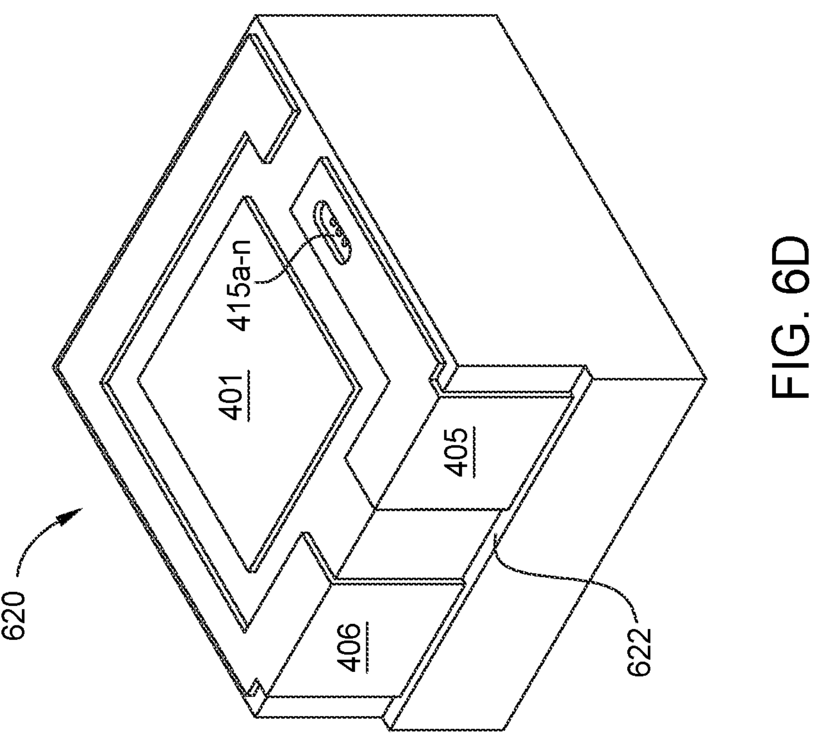
FIG. 6D is a perspective view of an example VCSEL, where the laser diode electrodes are disposed in a single trench having a width that is substantially the same size as a width of the VCSEL according to at least one embodiment of the present disclosure.
Figure 6C:
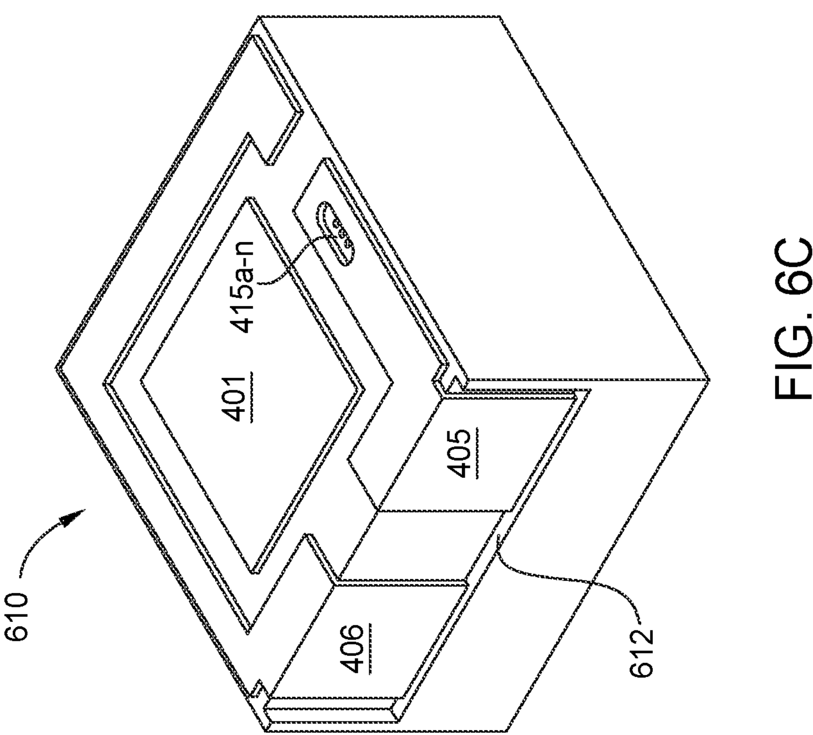
FIG. 6C is a perspective view of an example VCSEL, where the laser diode electrodes are disposed in a single trench having a width smaller than a width of the VCSEL, according to at least one embodiment of the present disclosure.

FIGS. 6A and 6B are schematic illustrations of a perspective view and a bottom view, respectively, of the VCSEL 410 chip shown in FIGS. 4A and 4B. FIGS. 6C and 6D illustrate non-limiting variations of the VCSEL 410 chip. In the orientation shown in FIGS. 6A-6D, the laser diode electrodes 405, 406 are positioned on, or coupled to, a side surface 410*e* of the VCSEL 410. The laser diode electrodes 405, 406 extend from the side surface 410*e* of the VCSEL 410 to the bottom surface 410*a* of the VCSEL 410. The pad 401, disposed on a bottom surface 410*a* of the VCSEL 410 is utilized to couple the VCSEL 410 to a slider, e.g., slider 404.

With respect to the variations of the VCSELs 410, 610, and 620, the number and width of the trenches in which the electrodes are disposed can be variable. For the VCSEL 410 shown in FIG. 6A, a first trench 601 in which a portion of laser diode electrode 405 is disposed, is separate from a second trench 602 in which laser diode electrode 406 is disposed.

With reference to the VCSEL 610 shown in FIG. 6C, the laser diode electrodes 405, 406 are disposed in a single trench 612 having a width that is smaller than a width of the VCSEL 610. Similarly, with respect to the VCSEL 620 shown in FIG. 6D, the laser diode electrodes 405, 406 are disposed in a single trench 622 having a width that is the same size, or substantially same size, as the width of the VCSEL 620. Like the VCSEL 410, VCSELs 610 and 620 can be positioned on a slider (e.g., slider 404) via the pad 401. Further, the laser diode electrodes 405 and 406 of VCSELs 610 and 620, like VCSEL 410, can be coupled to electrodes 503*a*, 503*b* of the HGA.

Figures 7A, 7B:
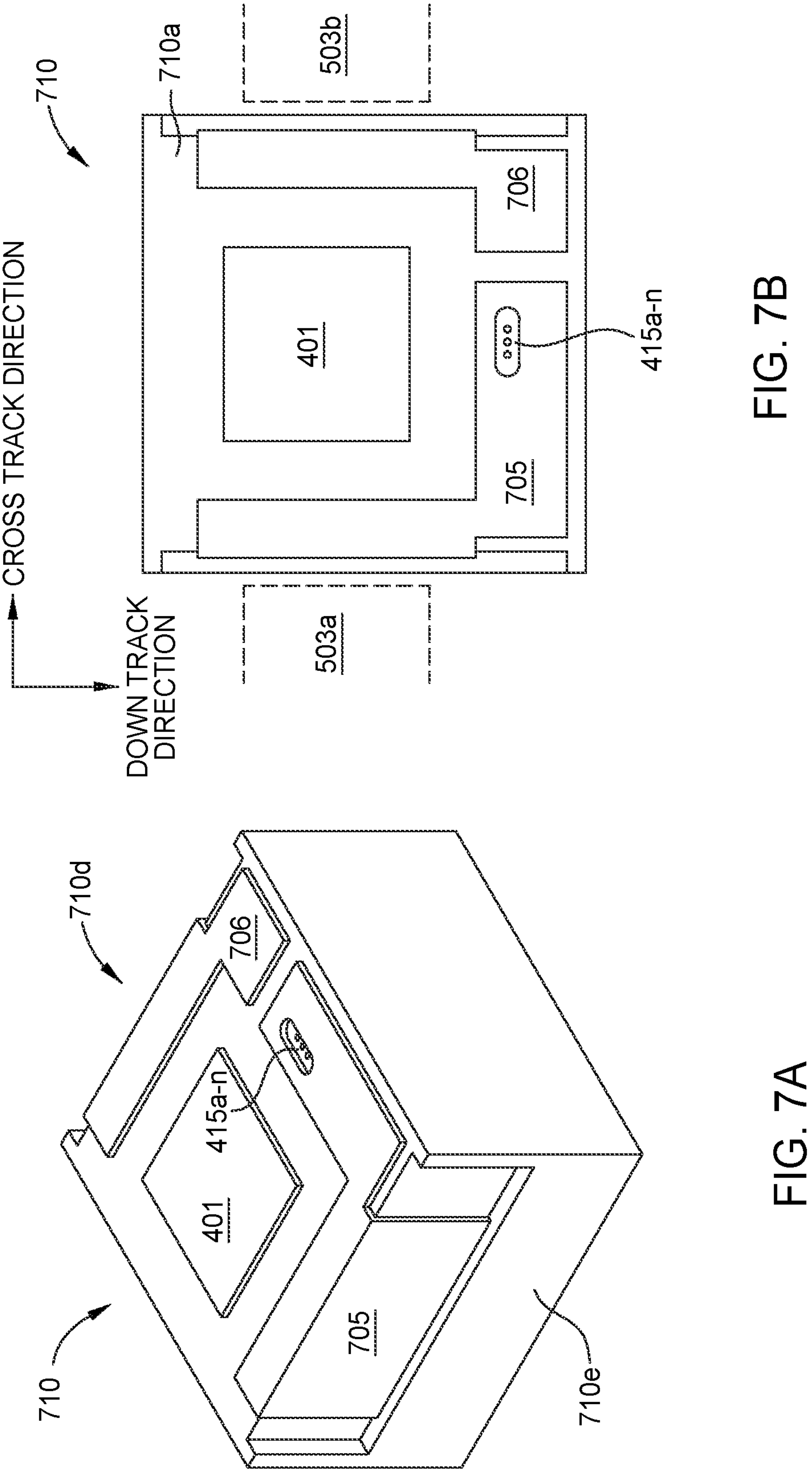
FIG. 7A is a perspective view of an example VCSEL according to at least one embodiment of the present disclosure.
FIG. 7B is a bottom view of the example VCSEL shown in FIG. 7A according to at least one embodiment of the present disclosure.

FIG. 7A and FIG. 7B are schematic illustrations of a perspective view and a bottom view, respectively, of a VCSEL 710 chip. Various elements of FIGS. 7A and 7B, such as the pad 401, cavity 415*a-n*, and electrodes 503*a*, 503*b* on the suspension can be the same as, or similar to, those elements described above in relation to FIGS. 4A and 4B. In the orientation shown in FIGS. 7A and 7B, laser diode electrodes 705, 706 are positioned on, or coupled to, two different surfaces of the VCSEL 710—side surfaces 710*e* and 710*d*, respectively. The laser diode electrodes 705, 706 extend from their respective side surfaces to the bottom surface 710*a* of the VCSEL 710.

Referring to FIG. 7B, the laser diode electrode 705 is coupled to electrode 503*a* of a suspension of an HGA (e.g., the head gimbal assembly 500) and the laser diode electrode 706 is coupled to electrode 503*b* of the suspension. A pad 401 disposed on a bottom surface 710*a* of the VCSEL 710 is utilized to couple the VCSEL 710 to a slider. VCSEL 710 can be positioned on a slider such as slider 404 shown in FIGS. 4A and 4B, though the orientation of the laser diode electrodes 705, 706 relative to the slider are different.

Properties, characteristics, and uses (e.g., in an HGA assembly, a magnetic media drive, etc.) of the VCSEL 710 chip can be the same as, or similar to, those properties, characteristics, and uses of the VCSEL 410 chip discussed above.

Figure 8A:
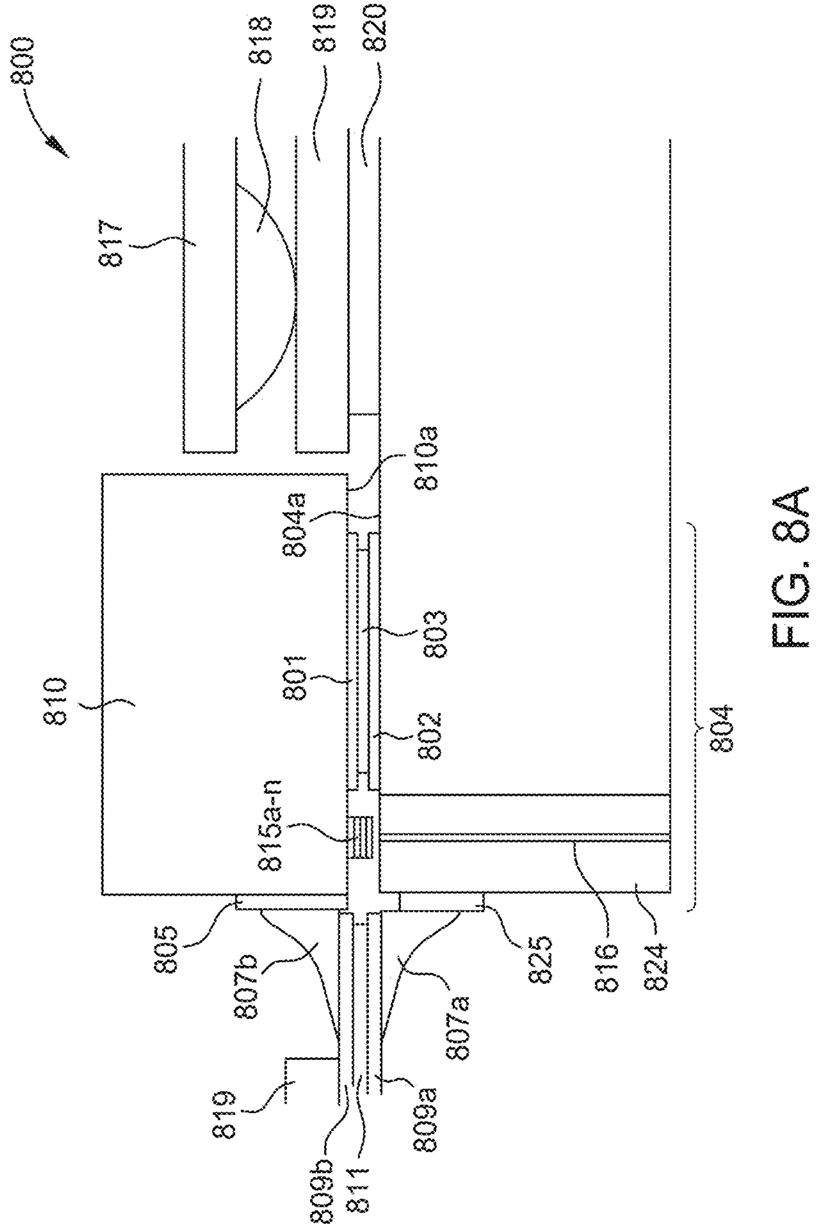
FIG. 8A is a schematic illustration of a cross-sectional view of an example slider having an example VCSEL mounted thereto according to at least one embodiment of the present disclosure.
Figures 8B, 8C:
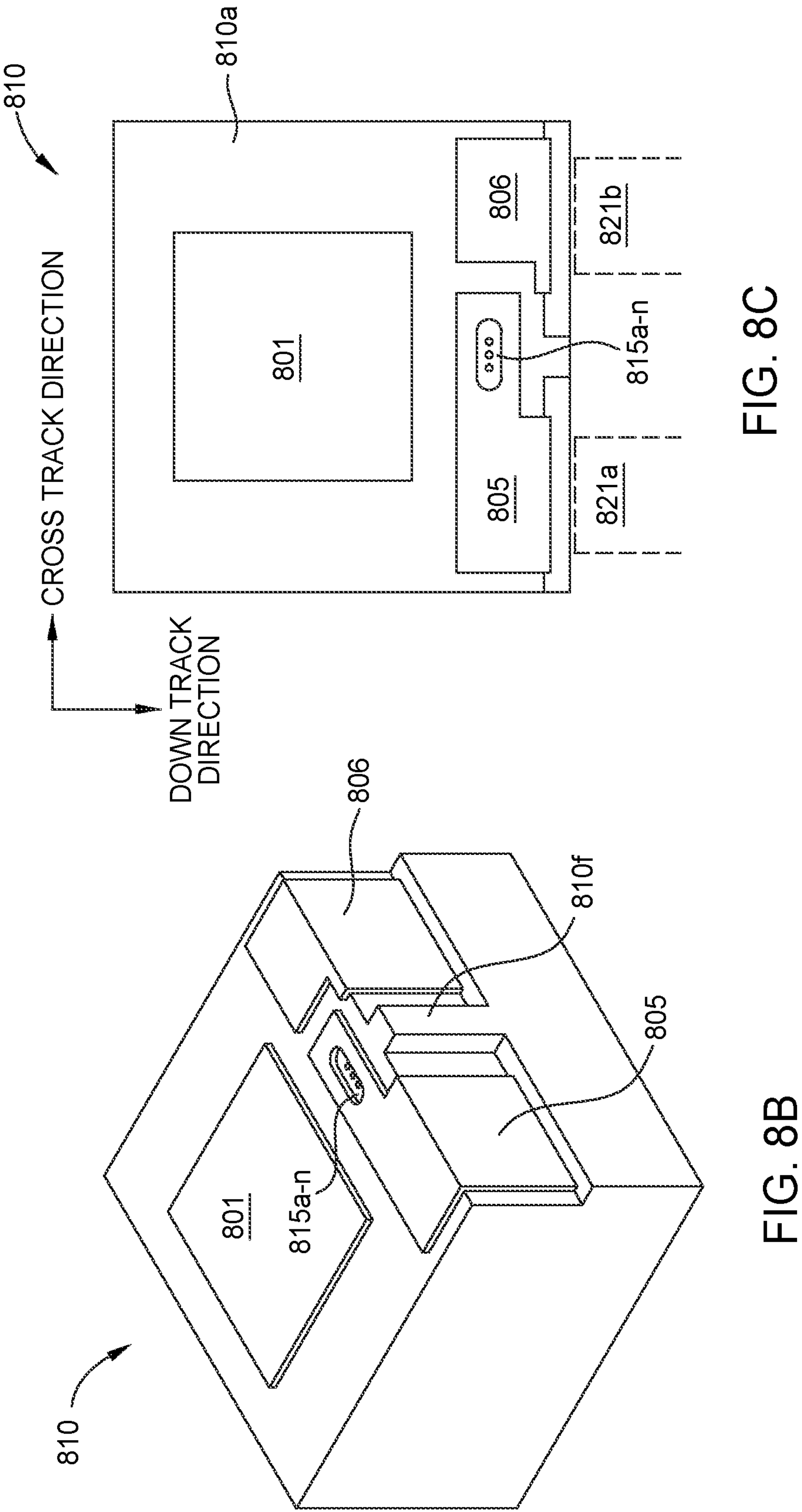
FIG. 8B is a perspective view of an example VCSEL according to at least one embodiment of the present disclosure.
FIG. 8C is a bottom view of the example VCSEL shown in FIG. 8B according to at least one embodiment of the present disclosure.
Figures 9A, 9B, 9C, 9D, 9E, 9F, 9G, 9H, 9I:
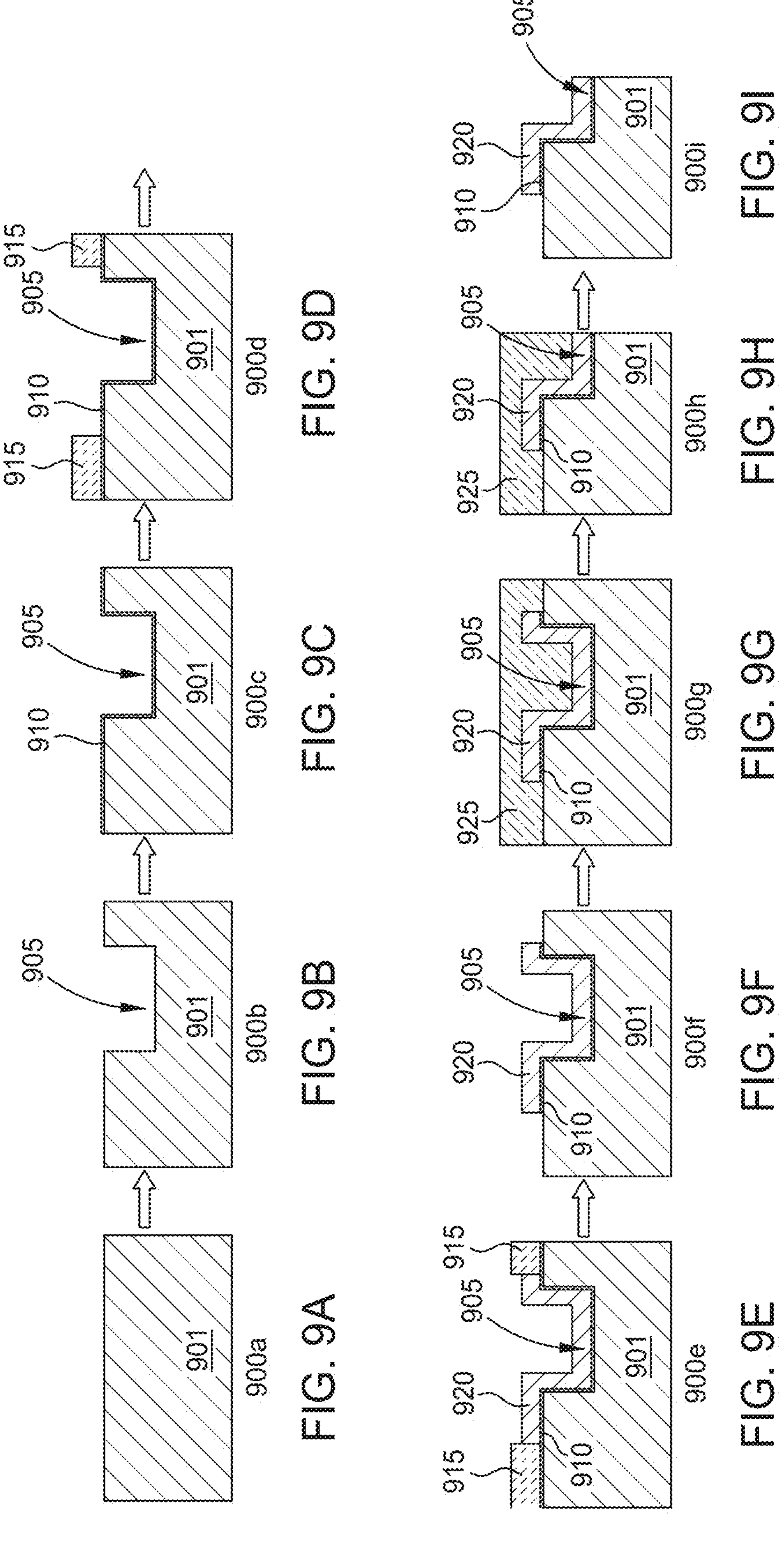
FIGS. 9A-9H are a process flow diagram showing selected operations of an example process for forming an electrode on a side surface of a VCSEL according to at least one embodiment of the present disclosure.

FIG. 8A is a schematic illustration 800 of a side view of a slider 804 having a VCSEL 810 chip mounted thereto according to some embodiments. The schematic illustration 800 can be a portion of an HGA. FIGS. 8B and 8C are a perspective view and a bottom view, respectively, of the VCSEL 810 shown in FIG. 8A. FIGS. 8A-8C are a special case of the VCSEL where the laser diode electrodes are located on the front surface 810*f* of the VCSEL 810. In these embodiments, the suspension can include double layer electrodes as shown in FIG. 8A, whereas the VCSEL 410, VCSEL 610, VCSEL 620, and VCSEL 710 include a single layer of electrodes on the suspension.

Referring to FIG. 8A, the VCSEL 810 is mounted to the slider 804 via a pad 801, a pad 802, and a soldering material 803. The pad 801 and the pad 802 can each, independently, be a metal containing layer. The slider 804 includes a substrate, e.g., an AlTiC substrate, and a layer 824, e.g., an alumina containing layer. The pad 801 is coupled to the bottom surface 810*a* of the VCSEL 810 and the pad 802 is coupled to a top surface 804*a* of the slider 804. The pad 801, the pad 802, and the soldering material 803 can collectively form a contact after soldering. A conductive adhesive can be used in addition to, or instead of, the soldering material 803.

A laser diode electrode 805 is coupled to, or positioned on, a front surface (e.g., a front surface 810*f*) of the VCSEL 810. Although only one laser diode electrode 805 is shown coupled to the front surface 810*f*, another laser diode electrode (e.g., laser diode electrode 806 shown in FIG. 8B) is coupled to the same front surface 810*f* of VCSEL 810. The laser diode electrodes 805, 806 extend from the front surface 810*f* of the VCSEL 810 to the bottom surface 810*a* of the VCSEL 810 as shown in FIGS. 8B and 8C.

The VCSEL 810 includes one or more cavities 815*a-n* through which one or more laser beams exit the VCSEL 810 and enter a single output waveguide 816 positioned within the layer 824. Any suitable number of cavities can be used such as from about 1 to about 16, such as from about 3 to about 12. Higher or lower number of cavities are contemplated. Each of the one or more laser beams emitted by the VCSEL 810 can operate at the same frequency and can be phase coherent. Each laser of the one or more laser beams emitted by the VCSEL 810 can have a power level from about 0.5 mW to about 20 mW, such as from about 1 mW to about 10 mW, such as from about 2 mW to about 8 mW, such as from about 4 mW to about 6 mW. Higher or lower power levels are contemplated. Although not shown, a multimode interference (MMI) device can be used and be disposed within the slider 804. When used, the MMI device combines the laser light fed from the cavities 815*a*-815*n* and emits a single laser through a single output waveguide 816. The single output waveguide 816 can emit laser light from the MMI device that includes the combined power of the plurality of input lasers accepted by the MMI device. The single output mode can be utilized to concentrate the optical power and couple to the NFT.

Referring to FIG. 8A, a slider pad 825 is coupled to a surface of the layer 824 of the slider 804. The slider pad 825 and the laser diode electrode 805 are coupled to a multilayer structure that includes a lower electrode 809*a*, a polyimide layer 811 disposed above the lower electrode 809*a*, and an upper electrode 809*b* disposed over the polyimide layer 811. Coupling of the slider pad 825 and the laser diode electrode 805 to the multilayer structure can be accomplished by soldering materials 807*a* and 807*b*, respectively. A conductive adhesive can be used in addition to, or instead of, the soldering materials 807*a*, 807*b*. Laser diode electrode 806 is also coupled to the multilayer structure in a same, or similar, manner as laser diode electrode 805.

A suspension (a portion of which is shown) which supports the slider 804 is disposed on the same surface of the slider 804 as the pad 802, e.g., a top surface 804*a*. A portion of the suspension is shown in FIG. 8A. The suspension includes a flexure 819 and a load beam 817. The load beam is the main body of the suspension. The flexure 819 holds the slider 804, and the flexure 819 is attached to the load beam 817. In operation, the load beam 817 can push the slider 804 toward a disk with a dimple 818. Between the flexure 819 and the slider 804 is disposed a polyimide layer 820 that includes wires. The wire layer is for applying current or voltage to the components in the slider (magnetic head, heater for spacing control etc.) or for sending signals from the sensors (reader, contact sensor, thermal sensor) to the preamp. In the bottom view of the VCSEL 810 (FIG. 8C) is shown the electrodes 821*a*, 821*b* on the suspension. In FIG. 8C, electrodes 821*a* and 821*b* correspond to the upper electrodes 809*b*. FIG. 8C also shows the directional movement, e.g., cross-track direction and down track direction, of the VCSEL 810.

One difference from FIG. 4A is the laser diode electrodes 805, 806 are not coupled to the multilayer structure in the same manner as that shown in FIG. 4A. The VCSEL 810 can be positioned on an HGA in a suitable manner similar to that shown in FIG. 5. Properties, characteristics, and uses (e.g., in an HGA assembly, a magnetic media drive, etc.) of the VCSEL 810 chip can be the same as, or similar to, those properties, characteristics, and uses of the VCSEL 410 chip discussed above.

The VCSELs described herein enable, e.g., active alignment to maximize the coupling between the waveguide and the laser during their use. The VCSELs described herein have an output beam that is larger and more circular than that of an EELD which increases the alignment tolerance and coupling efficiency to the slider spot size converter. Further, VCSELs described herein have mode hop-free operation due to, e.g., very short cavity length with one longitudinal mode and DBR mirror selectivity while EELDs suffer from mode hops. Mode hopping can cause a small (typically 1-2%) change in laser power to suddenly occur during the recording process. The VCSELs do not require burn-in during manufacturing which further lowers cost. Since the VCSEL cavity length is shorter than EELDs, and because the laser is mounted on top of the slider, the lower overall height allows for a reduced disk-to-disk spacing, potentially more disks, and for higher HDD capacity.

A trench or protrusion around the metal pad (e.g., pad 401) for soldering can be utilized. The solder between the VCSEL and the slider (e.g., slider 404) may expand during the soldering process and contact the laser diode electrodes of the VCSEL. In some embodiments, and to prevent (or at least mitigate) the solder (e.g., soldering material 403) from contacting the laser diode electrodes of the VCSEL, a trench or a protrusion may be formed around the pad for soldering. The depth of the trench can be, e.g., about 10 μm, but it may be larger or smaller. The height of the protrusion can be equal to a thickness of the metal layer plus the thickness of the solder, but it may be larger or smaller. In some embodiments, an insulating layer may be deposited on or near the trench or the protruded area.

In some embodiments, at least one of the laser diode electrodes may be combined with the pad for mounting if the pad is electrically isolated or grounded. For example, the spacing between a laser diode electrode and the pad for mounting can be about zero.

Example Fabrication Processes

Figure 10:
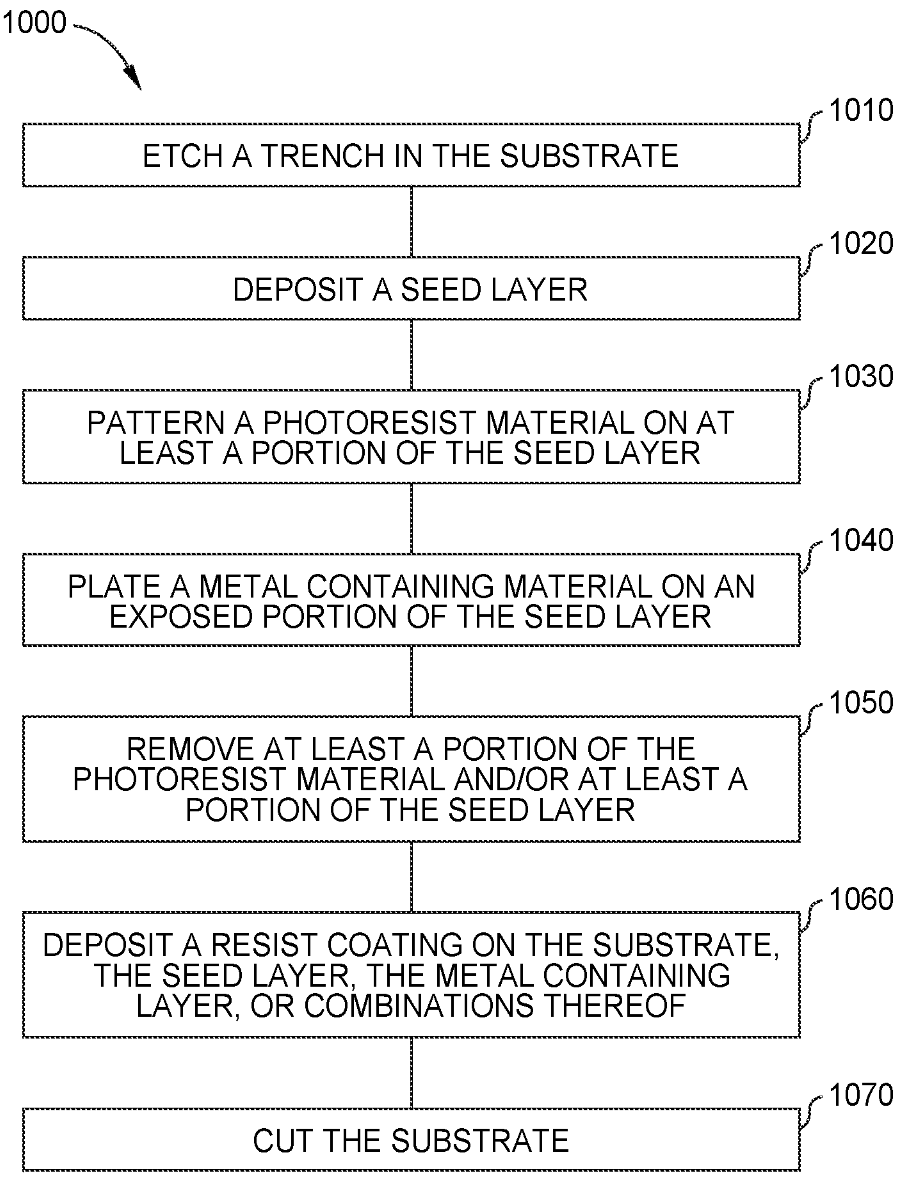
FIG. 10 is a flowchart showing selected operations of an example process for forming an electrode on a side surface of a VCSEL according to at least one embodiment of the present disclosure.

The present disclosure also relates to fabrication processes for forming a portion of one or more VCSELs described herein. FIGS. 9A-9H are a process flow diagram showing selected operations on a substrate during an example process 1000 (FIG. 10) for forming an electrode on a side surface of a VCSEL.

The process begins with selecting a substrate 900*a*. The substrate may be formed of a suitable substrate material 901. Materials suitable for the substrate material 901 include, but are not limited to, Ga, As, Al, In, alloys thereof, and combinations thereof. Illustrative, but non-limiting, examples of materials suitable for the substrate material 901 include GaAs, AlAs, AlGaAs, InGaAs, InGaAsN, GaAsN, GaAsP, InP, InGaAsP.

The substrate material 901 is then etched by suitable methods to form a trench 905 at operation 1010. This etch process to form a wafer 900*b* can be a single-step etch treatment or a multi-step etch treatment (e.g., a two-step etch treatment, a three-step etch treatment, or more steps). The area etched for each step of the multi-etch treatment can be different. Etching can be performed by a dry etch plasma, utilizing wet etchants, ion milling, reactive ion etch, reactive ion beam etching, or combinations thereof. The etch process of operation 1010 can be performed in order to form n trenches of n depths. For example, a first trench having a first depth can be formed, a second trench having a second depth can be formed, a third trench having a third depth can be formed, and so forth. The depths of the trenches can be the same or different. As a non-limiting example of operation 1010, the etch process can be achieved by a reactive ion etch utilizing suitable etchant materials such as a chlorine-containing material (e.g., HCl and/or $Cl_2$), but any number of gases or mixtures thereof could be used. A carrier gas such as a non-reactive gas, e.g., argon, can be utilized during the etch process of operation 1010.

A seed layer 910 comprising a suitable conductive material such as copper (Cu), chromium (Cr), titanium, nickel (Ni), a noble metal (e.g., ruthenium (Ru), rhodium (Rh), iridium (Ir), palladium (Pd), platinum (Pt), and/or gold (Au)), or combinations thereof, can then be deposited at operation 1020 to form a wafer 900*c*. Other metals are contemplated. In some embodiments, the seed layer 910 can be deposited as a single layer or as a plurality of layers. Here, for example, different metals can be used for each individual layer of the plurality of layers of the seed layer 910. Additionally, or alternatively, the single layer or the plurality of layers of the seed layer 910 can include an alloy of two or more such metals. The seed layer 910 is deposited in the trench 905, on one or more sidewalls of the trench 905, and/or the surface of the substrate that extends above the trench 905. The seed layer formed at operation 1020 can be an electrode for a VCSEL. The seed layer is typically referred to as an underlayer when the metal electrode is depositing with methods other than plating.

The deposition of operation 1020 can be performed by a suitable technique such as sputtering, atomic layer deposition (ALD), and/or ion beam deposition (IBD). Other suitable metal deposition techniques for depositing the seed layer 910, such as electron-beam and/or resistive evaporation, can be utilized in addition to, or as an alternative to, sputtering, ALD, and/or IBD. The directionality of the deposition can be controlled when using IBD, examples of which are shown in various example process schemes of FIGS. 13-16 discussed below (as indicated by arrows 1307, 1407, 1507, and 1607 of the respective figures). Generally, IBD can be used when it is desired to not form a layer of material over the whole trench. Although IBD is shown in various process schemes, additional or alternative deposition techniques can be utilized such as those described herein. Angled deposition can also be used for electrode deposition.

In some embodiments, and prior to depositing the seed layer 910, an insulating layer (e.g., $SiO_2$ and/or $Al_2O_3$) may be deposited on at least a portion of the wafer 900*b*, such as in the trench 905, the one or more sidewalls of the trench 905, and/or the surface of the substrate that extends above the trench 905. The seed layer 910 can then be deposited on at least a portion of this insulating layer if desired. The insulating layer can allow for, e.g., isolation of the laser diode electrodes.

A photoresist material 915 can then be patterned on wafer 900*c* by a suitable photolithographic process on at least a portion of the seed layer 910 at operation 1030. The photoresist material 915 can be formed using spray coating, spin coating, or other suitable methods. The wafer 900*d*, having a photoresist material disposed thereon, is utilized to control plating of a metal-containing layer in a subsequent operation discussed below. In some embodiments, a thickness of the photoresist material 915 can be selected such that the photoresist material 915 is removed in a subsequent operation (e.g., an operation after plating) and can range in thickness from about 3 μm to about 15 μm, such as from about 4 μm to about 12 μm. The photoresist material 915 having a larger or smaller thickness is contemplated. If desired, a plasma clean using, e.g., $O_2$ and/or water in combination with ammonium hydroxide ($NH_4OH$), can be performed to clear some or all of the photoresist left on undesired portions of the seed layer 910.

Once the opened areas, as defined by the photoresist material 915, are formed, a metal plate 920 is then deposited by suitable methods on at least a portion of wafer 900*d* to form a wafer 900*e* at operation 1040. For example, the metal plate 920 can be plated onto at least a portion of the seed layer 910 such as portions of the seed layer in the trench, or sidewall thereof, as well as on the surface of the seed layer 910 above the trench 905. The metal plate 920 can include non-metals. Illustrative, but non-limiting, examples of metals useful for operation 1040 include those metals discussed above for the seed layer, such as Au, Cu, Pd, Pt, or combinations thereof, though other metals are contemplated. The thickness of the metal plate 920 can vary. In some embodiments, the thickness of the metal plate 920 is from about 1 μm to about 15 μm, such as from about 2 μm to about 10 μm, such as from about 3 μm to about 5 μm. Larger or smaller thicknesses of the metal plate 920 are contemplated.

The metal plate 920 can be deposited by plating, but other deposition methods such as sputtering, vacuum evaporation, and/or ion beam deposition (IBD) can be used. When sputtering, vacuum evaporation, and/or IBD are used, operation 1020 (formation of the seed layer 910) can be skipped, if desired. As described above, the directionality of the deposition of the metal plate 920 can be controlled using IBD. For example, and as shown in FIGS. 13-16, the directionality of the IBD can be the same or similar direction as shown for the seed layer deposition (as indicated by arrows 1307, 1407, 1507, and 1607 of the respective figures).

At least a portion of the photoresist material 915 and/or at least a portion of the seed layer 910 is then removed from the wafer 900*e* by suitable methods, such as milling, at operation 1050. As shown by wafer 900*f*, portions of the seed layer 910 that are removed during operation 1050 can include those that were previously disposed below the photoresist material 915.

The milling process of operation 1050 can be performed utilizing solvent(s), a plasma clean, or a combination thereof. The wafer 900*f*, now formed, includes various exposed surfaces, such as exposed surfaces of the substrate material 901, exposed surfaces of the metal plate 920, and/or exposed surfaces of the seed layer 910. If desired, operation 1050 can be performed in more than one operation whereby the at least a portion of the photoresist material 915 is removed prior to the at least a portion of the seed layer 910. In some embodiments, a portion of the metal plate 920 can be removed during or after removal of the seed layer 910 by, e.g., milling. Since the thickness of the metal plate 920 is thicker than the seed layer 910, the seed layer 910 outside the metal plate 920 area is removed but the metal plate 920 remains.

Alternatively, and in some embodiments, the seed layer 910 can be patterned using photolithography before plating of the metal plate 920 such that the example process 1000 for forming the VCSEL can be free of milling the seed layer 910.

An optional operation 1060 can then be performed to deposit a resist coating 925 on one or more exposed portions of the wafer 900*f* to form a wafer 900*g*. The resist coating 925 can be formed using spray coating, spin coating, and/or other suitable methods. Illustrative, but non-limiting, examples of photoresist types used for the resist coating 925 can include UV negative resist, g/i-line positive resist, KrF positive resist, and/or ArF positive resist. As illustrated by the wafer 900*g*, the deposition forms the resist coating 925 on at least a portion of the metal plate 920, at least a portion of the seed layer 910, at least a portion of the substrate material 901, or combinations thereof. The resist coating 925 serves to, e.g., protect the metal plate 920, seed layer 910, substrate material 901, or combinations thereof, during a subsequent dicing operation.

The wafer 900*g* is then diced, sliced, cleaved, or otherwise cut into one or more individual chips 900*h* at operation 1070. Here, and in some embodiments, the wafer is cut along the trench 905 into discrete die with a blade, saw, scribe, laser dicing, stealth dicing, and/or other suitable apparatus using suitable methods.

If the one or more individual chips 900*h* include a resist coating 925 (e.g., formed during the optional operation 1060), the resist coating 925 can be removed after the dicing operation to form wafer 900*i*. Removal of the resist coating 925 can be performed by, e.g., by dipping the wafer in resist removal solution, placing the wafer in an $O_2$ asher, and/or other suitable methods.

Other operations can include cleaning the wafer before and/or after one or more operations of the example process 1000. Cleaning can be performed by suitable methods such as dipping in a cleaning solution, ultrasonic cleaning, UV/$O_3$ cleaning, brush cleaning, polishing, and/or $CO_2$ cleaning.

Other illustrative, but non-limiting, example process flow diagrams for forming laser diode electrode(s) on one or more side surfaces of a VCSEL are shown in FIGS. 11A-17H. The processes of FIGS. 11A-17H generally follow the flowchart illustrated in FIG. 10; however, the wafer that is formed after the optional deposition process of operation 1060 (e.g., to form resist coating 925 of wafer 900*g*) is not illustrated in FIGS. 11A-17H.

The general process schemes shown in FIGS. 11A-17H include the following operations: etch a trench; deposit a seed layer; pattern a photoresist layer; plate a metal; remove at least a portion of the photoresist layer and/or seed layer; and dice/cut the wafer. Embodiments and implementations of these operations are described elsewhere in the Application.

Table I shows numeral listings, corresponding to FIGS. 11A-17H, for the various wafers and features formed during processing according to some embodiments. As discussed above, the directionality of the seed layer deposition (operation 1020) can be controlled using IBD. Arrows 1307, 1407, 1507, and 1607 with the respective FIGS. 13A-16H illustrate the directionality of the IBD if utilized during VCSEL processing. Although IBD is shown in various process schemes, additional or alternative deposition techniques can be utilized for deposition of the seed layer such as those described herein.

TABLE I

| | FIG. 11A-11H | FIG. 12A-12H | FIG. 13A-13H | FIG. 14A-14H | FIG. 15A-15H | FIG. 16A-16H | FIG. 17A-17H |
|---|---|---|---|---|---|---|---|
| Substrate material | 1101 | 1201 | 1301 | 1401 | 1501 | 1601 | 1701 |
| Trench | 1105 | 1205 | 1305 | 1405 | 1505a | 1605a | 1705 |
| Second trench | — | — | — | — | 1505b | 1605b | — |
| Third trench | — | — | — | — | — | 1605c | — |
| Seed layer | 1110 | 1210 | 1310 | 1410 | 1510 | 1610 | 1710 |
| Photoresist material | 1115 | 1215 | 1315 | 1415 | 1515 | 1615 | 1715 |
| Metal plate | 1120 | 1220 | 1320 | 1420 | 1520 | 1620 | 1720 |
| Substrate | 1100a | 1200a | 1300a | 1400a | 1500a | 1600a | 1700a |
| Wafer after etch (operation 1010) | 1100b | 1200b | 1300b | 1400b | 1500b | 1600b | 1700b |
| Wafer after seed layer deposition (operation 1020) | 1100c | 1200c | 1300c | 1400c | 1500c | 1600c | 1700c |
| Wafer after photoresist pattering (operation 1030) | 1100d | 1200d | 1300d | 1400d | 1500d | 1600d | 1700d |
| Wafer after metal plating (operation 1040) | 1100e | 1200e | 1300e | 1400e | 1500e | 1600e | 1700e |

TABLE I-continued

| | FIG. 11A-11H | FIG. 12A-12H | FIG. 13A-13H | FIG. 14A-14H | FIG. 15A-15H | FIG. 16A-16H | FIG. 17A-17H |
|---|---|---|---|---|---|---|---|
| Wafers after resist removal/seed removal (operation 1050) | 1100f/ 1100g | 1200f/ 1200g | 1300f/ 1300g | 1400f/ 1400g | 1500f/ 1500g | 1600f/ 1600g | 1700f/ 1700g |
| Wafer after dicing operation 1070 | 1100h | 1200h | 1300h | 1400h | 1500h | 1600h | 1700h |

Figures 11A, 11B, 11C, 11D, 11E, 11F, 11G, 11H:
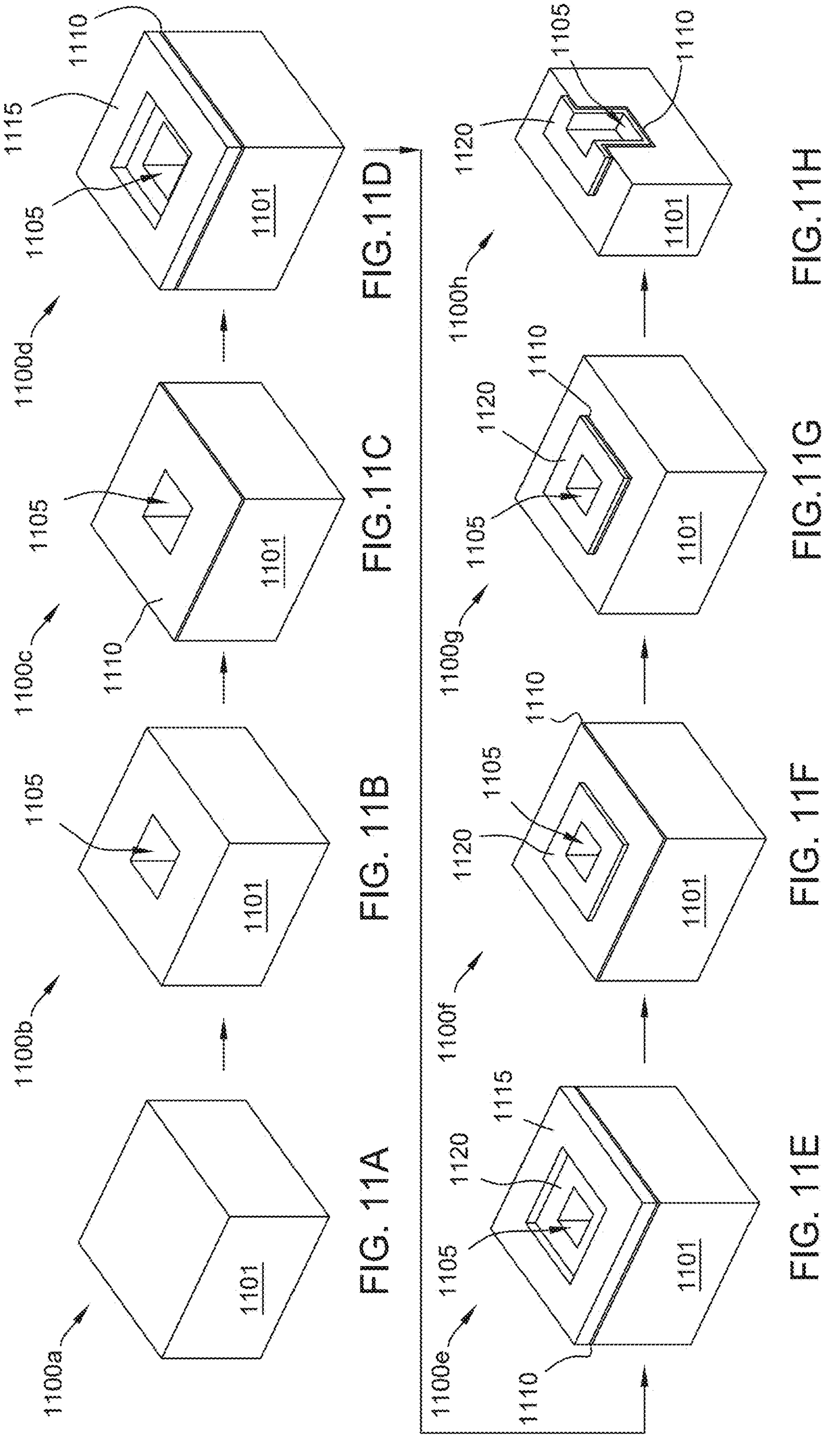
FIGS. 11A-11H are a process flow diagram showing selected operations of an example process for forming an electrode on a side surface of a VCSEL according to at least one embodiment of the present disclosure.
Figures 12A, 12B, 12C, 12D, 12E, 12F, 12G, 12H:
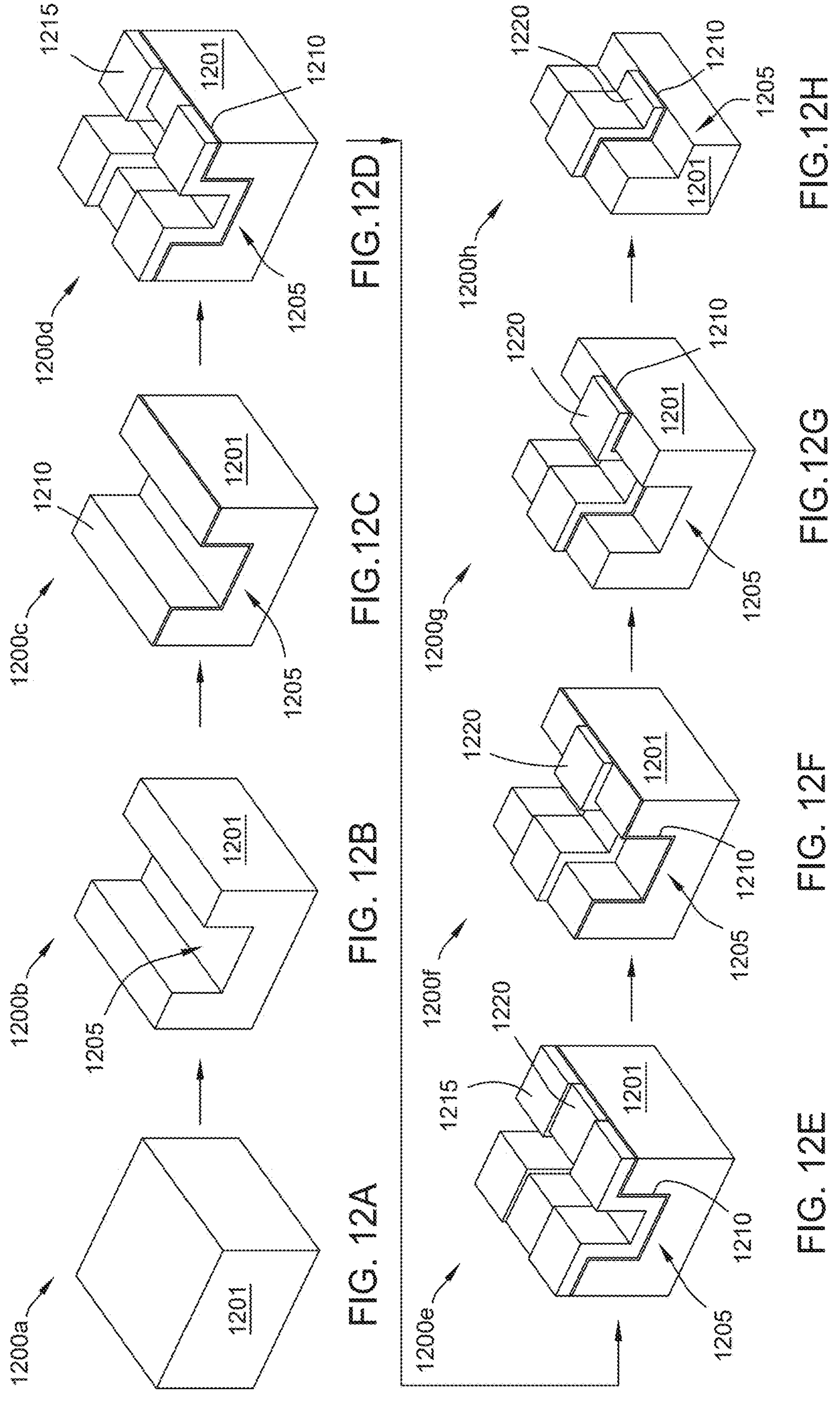
FIGS. 12A-12H are a process flow diagram showing selected operations of an example process for forming an electrode on a side surface of a VCSEL according to at least one embodiment of the present disclosure.
Figures 13A, 13B, 13C, 13D, 13E, 13F, 13G, 13H:
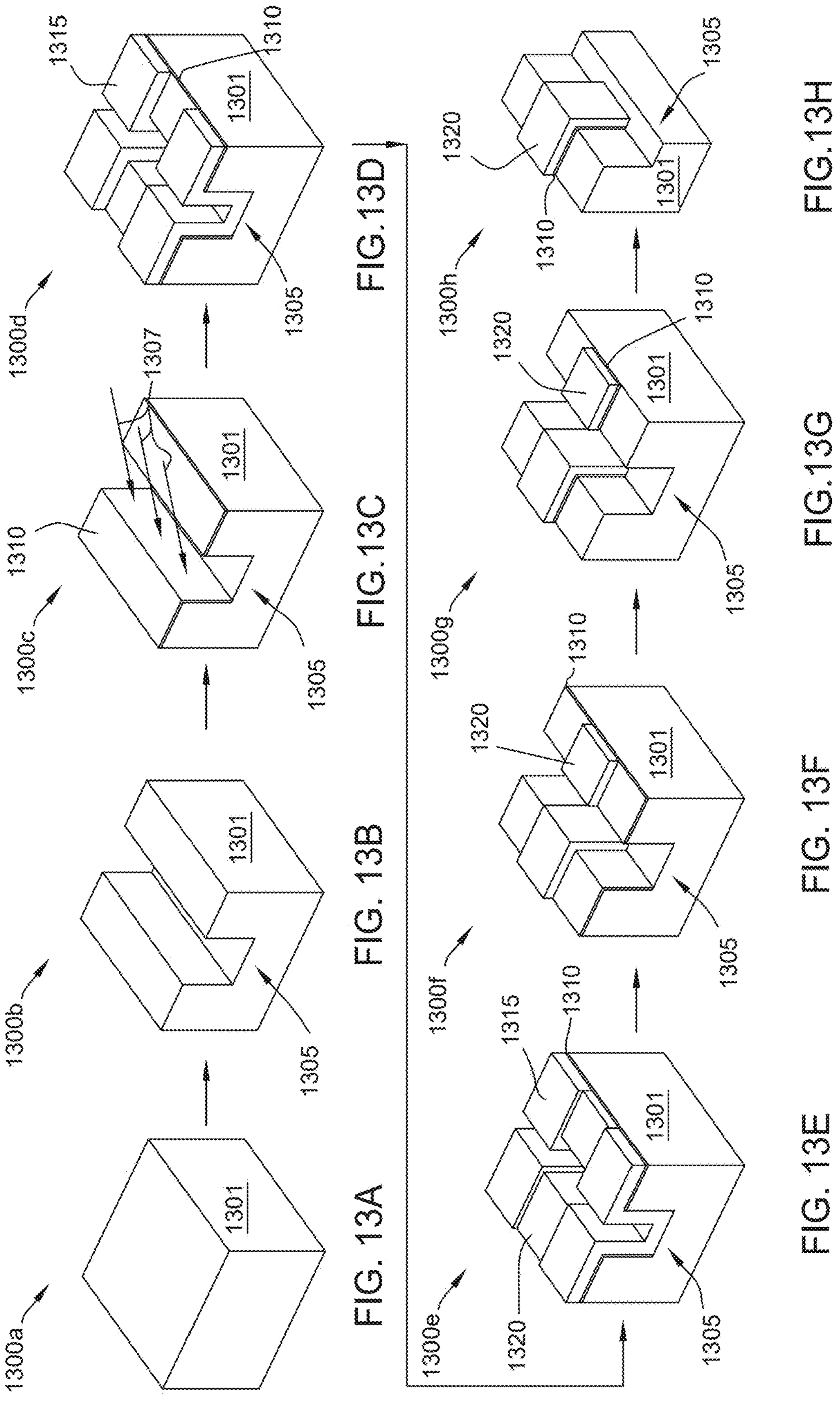
FIGS. 13A-13H are a process flow diagram showing selected operations of an example process for forming an electrode on a side surface of a VCSEL according to at least one embodiment of the present disclosure.
Figures 14A, 14B, 14C, 14D, 14E, 14F, 14G, 14H:
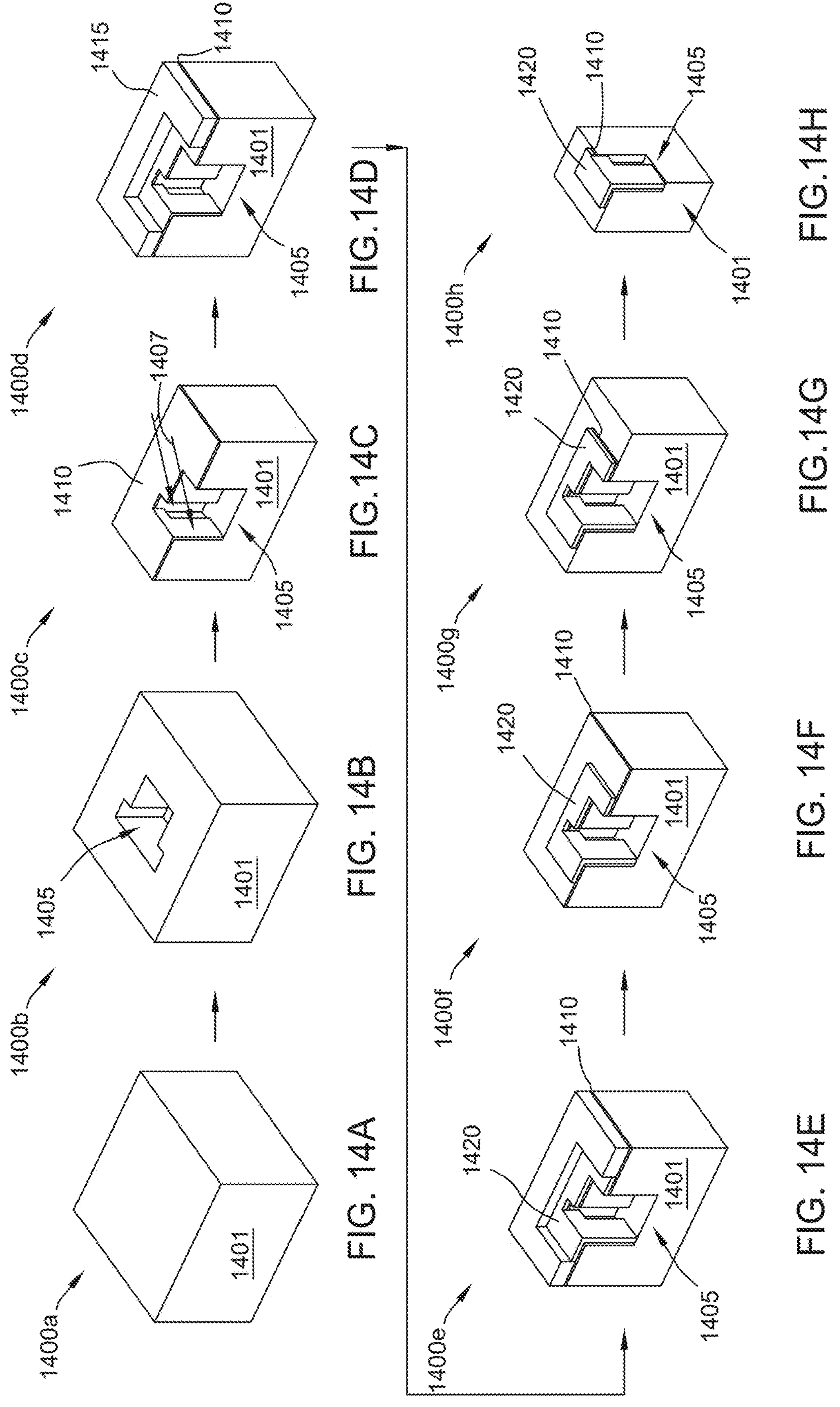
FIGS. 14A-14H are a process flow diagram showing selected operations of an example process for forming an electrode on a side surface of a VCSEL according to at least one embodiment of the present disclosure.
Figures 15A, 15B, 15C, 15D, 15E, 15F, 15G, 15H:
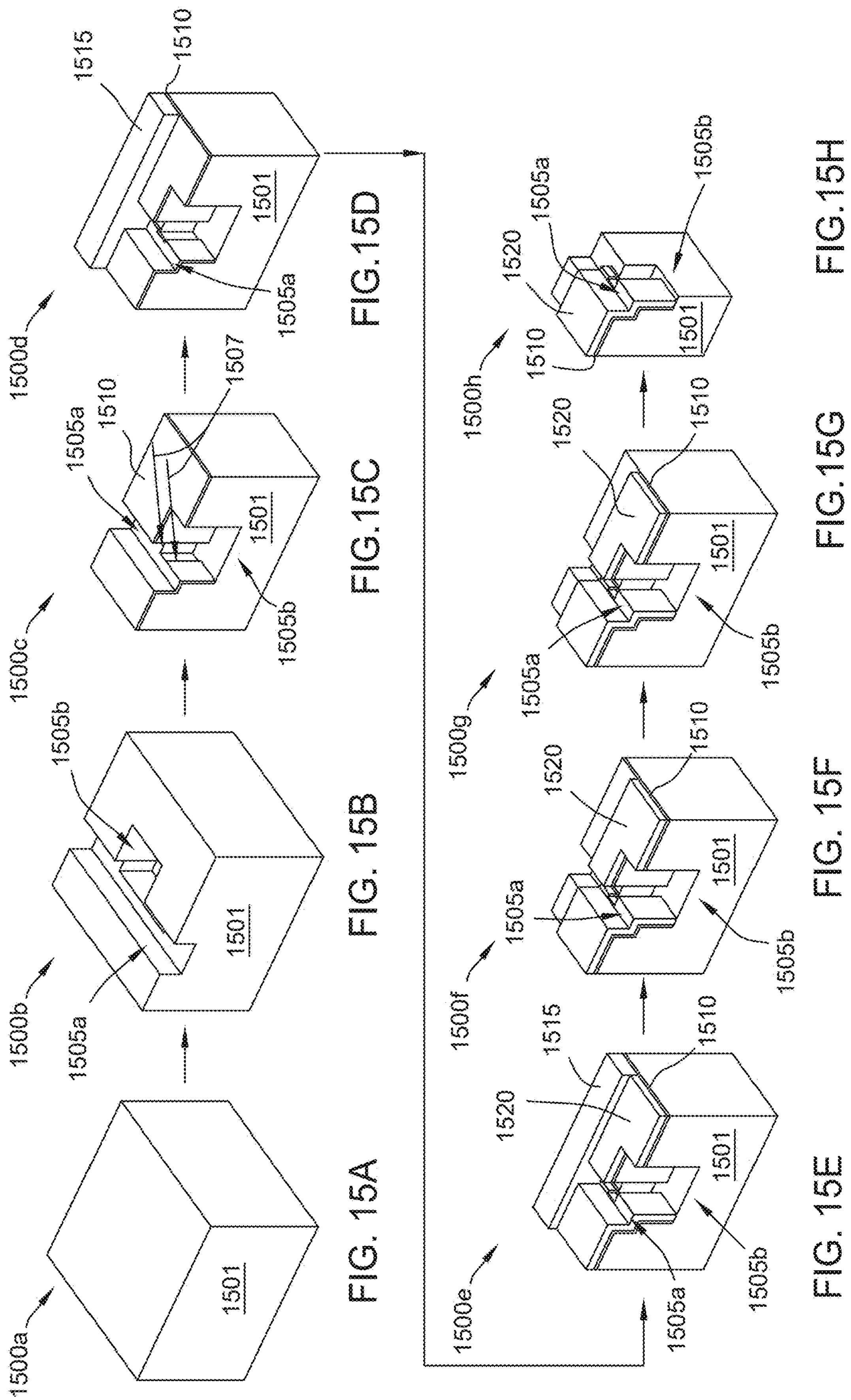
FIGS. 15A-15H are a process flow diagram showing selected operations of an example process for forming an electrode on a side surface of a VCSEL according to at least one embodiment of the present disclosure.
Figures 16A, 16B, 16C, 16D, 16E, 16F, 16G, 16H:
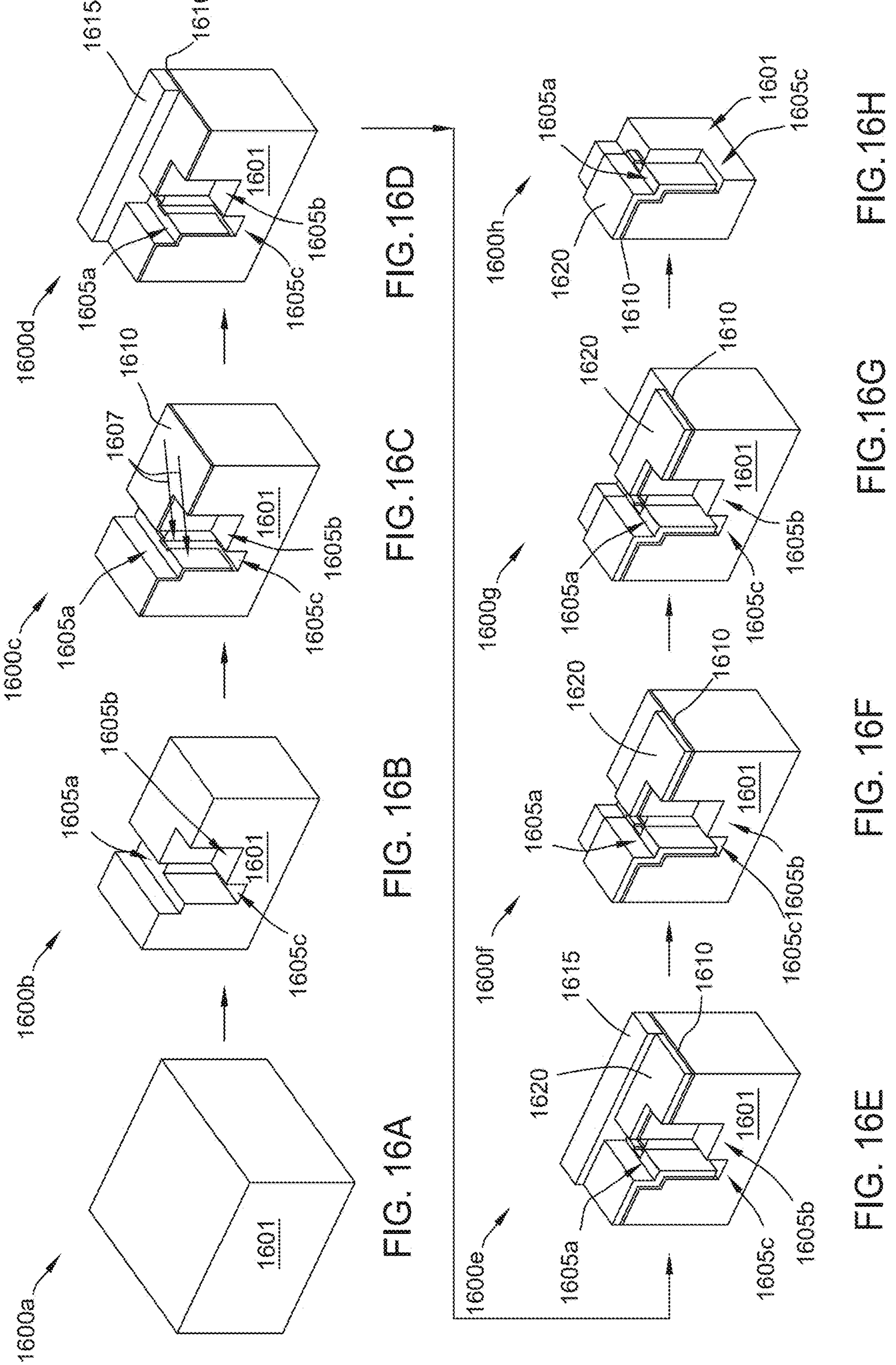
FIGS. 16A-16H are a process flow diagram showing selected operations of an example process for forming an electrode on a side surface of a VCSEL according to at least one embodiment of the present disclosure.
Figures 16E, 17A, 17B, 17C, 17D, 17F, 17G, 17H:
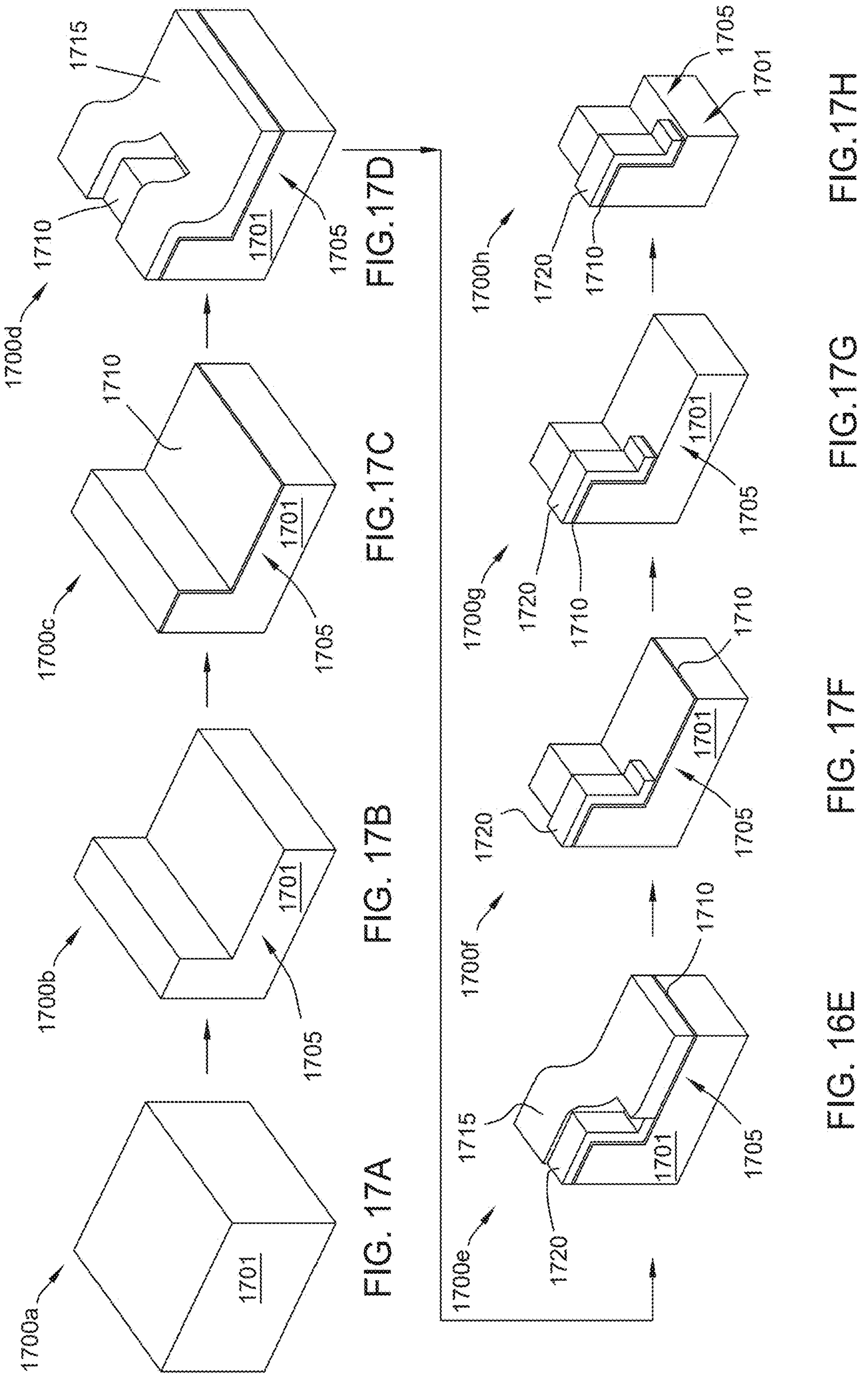

As shown in FIGS. 11-11H, the metal plate 1120 (e.g., the electrode) is isolated from the laser diode electrode (e.g., laser diode electrode 405 and/or laser diode electrode 406 in FIG. 6B; laser diode electrode 705 and/or laser diode electrode 706 in FIG. 7B; or laser diode electrode 805 and/or laser diode electrode 806 in FIG. 8C). In some embodiments, the metal plate 1120 can be extended to the laser diode electrode or connected to the laser diode electrode through additional structures.

As illustrated in some of the process examples, multiple trenches can be formed to, e.g., control the position of the bottom edge and/or the side edge of the laser diode electrode. For example, and as shown in FIGS. 15A-15H, a 2-step etching can be performed to form a shallow trench 1505*a* and a deep trench 1505*b*. In another example, and as shown in FIGS. 16A-16H, a 3-step etching can be performed to form a shallow trench 1605*a*, a first deep trench 1605*b*, and a second deep trench 1605*c*. Multi-step etching can be performed by suitable methods. Although the shapes of the substrates/wafers shown in the process flow diagrams are square-shaped or substantially square-shaped, other shapes are contemplated. Similarly, various shapes of the trenches and layers are contemplated.

Figures 18A, 18B, 19:
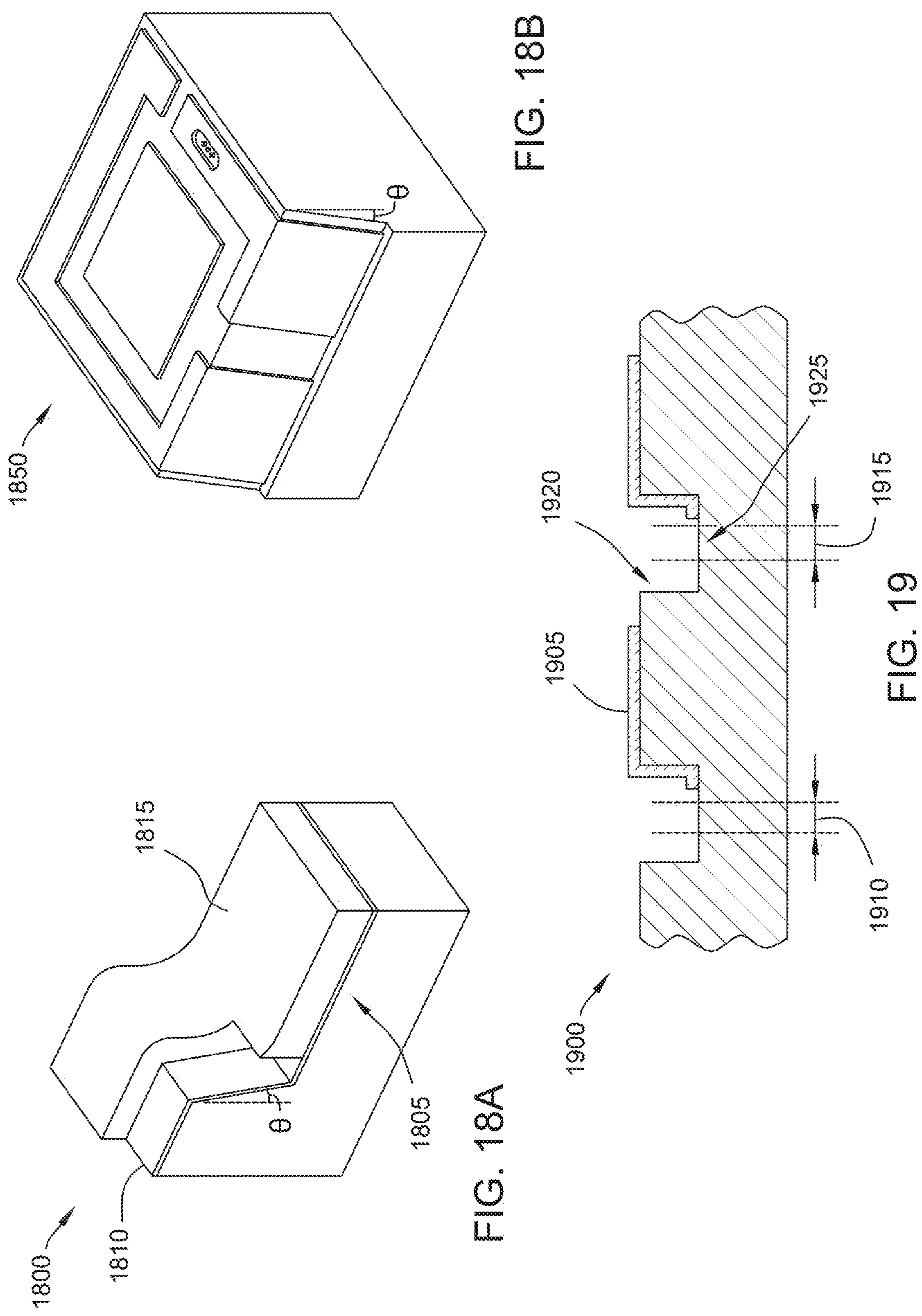
FIG. 18A is a portion of a wafer showing variable angles of the sidewall formed during processing according to at least one embodiment of the present disclosure.
FIG. 18B shows the location of the angled sidewall from FIG. 18A in the VCSEL formed after processing according to at least one embodiment of the present disclosure.
FIG. 19 shows a process variation 1900 where a trench 1925 is etched on a different side of the VCSEL according to at least one embodiment of the present disclosure.

FIGS. 18A and 18B generally illustrate variations for processing according to at least one embodiment of the present disclosure. Specifically, FIG. 18A is a portion of a wafer 1800 showing variable angles of the angled sidewall during processing. For clarity, only the trench 1805, seed layer 1810, and the photoresist material 1815 are illustrated. The sidewall angle (8) can be selected to, e.g., make etching, photoresist patterning, as well as other process operations simpler. For example, when 8 is zero, exposure of the sidewall to photoresist is difficult. Selection of a non-zero value for 8 renders the sidewall more amenable to photolithography and/or other process operations. As an example, θ can be about 1° to about 10°, such as from about 5° to about 10°, though larger or smaller values of 8 are contemplated. FIG. 18B shows the location of the angled sidewall in the VCSEL 1850 formed after processing. Angled sidewalls can be utilized with one or more process flow diagrams described herein.

FIG. 19 shows a process variation 1900 where a trench 1925 is etched on a different side of the VCSEL according to at least one embodiment of the present disclosure. Here, the opposite side of the VCSEL (the side 1920 without a laser diode electrode 1908) can be etched to form the trench 1925 during VCSEL processing. This additional etch can be performed to, e.g., increase the width of the trenches enabling simpler dicing of the substrate (widths of the dicing saws are illustrated by numerals 1910 and 1915). Additionally, or alternatively, the additional etch can be performed to reduce a thickness of a photoresist material to be deposited, thereby enabling a more conformal coating of the photoresist material. Moreover, the additional etch can allow for simpler exposure of the sidewall to photoresist materials during photolithography processes. The process variation shown in FIG. 19 can be utilized with one or more process flow diagrams described herein.

VCSELs, HGAs for mounting VCSELs, and devices incorporating such articles such as magnetic media drives are provided herein. Processes for fabricating VCSELs are also provided. The embodiments described herein, unlike conventional VCSELs, enable, e.g., active alignment to maximize the coupling between the waveguide and the laser during use.

In the foregoing, reference is made to embodiments of the disclosure. However, it should be understood that the disclosure is not limited to specific described embodiments. Instead, any combination of the foregoing features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the foregoing aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

For purposes of this present disclosure, and unless otherwise specified, all numerical values within the detailed description and the claims herein are modified by "about" or "approximately" the indicated value, and consider experimental error and variations that would be expected by a person having ordinary skill in the art. For the sake of brevity, only certain ranges are explicitly disclosed herein. However, ranges from any lower limit may be combined with any upper limit to recite a range not explicitly recited, as well as, ranges from any lower limit may be combined with any other lower limit to recite a range not explicitly recited, in the same way, ranges from any upper limit may be combined with any other upper limit to recite a range not explicitly recited. Additionally, within a range includes every point or individual value between its end points even though not explicitly recited. Thus, every point or individual value may serve as its own lower or upper limit combined with any other point or individual value or any other lower or upper limit, to recite a range not explicitly recited.

As used herein, the indefinite article "a" or "an" shall mean "at least one" unless specified to the contrary or the context clearly indicates otherwise.

While the foregoing is directed to embodiments of the present disclosure, other and further embodiments of the disclosure may be devised without departing from the basic scope thereof, and the scope thereof is determined by the claims that follow.

What is claimed is:

1. A process for forming a vertical cavity surface emitting laser (VCSEL) device, comprising:

forming a trench in a first surface of a substrate, the trench comprising a first surface perpendicular to the first surface of the substrate, a second surface parallel to the first surface, and a third surface perpendicular to the first and second surfaces of the trench, the third surface of the trench connecting the first and second surfaces of the trench;

forming two laser diode electrodes in the trench, wherein forming the two laser diode electrodes in the trench comprises:

depositing a seed layer comprising a conductive material on the substrate, the seed layer being disposed on the first, second, and third surfaces of the trench;

patterning a photoresist material on the seed layer, wherein the photoresist material is disposed within at least a portion of the trench; and depositing a metal containing material on at least a portion of the seed layer that is free of the photoresist material, the metal containing material being disposed over the first, second, and third surfaces of the trench, and over a portion of the first surface of the substrate adjacent to the first and second surfaces of the trench; and after forming the two laser diode electrodes, cutting the substrate along the trench to form a VCSEL, the VCSEL comprising:

a chip for mounting on a slider, the chip having six surfaces, wherein:

a first surface of the chip is for facing the slider;

a second surface of the chip is opposite the first surface of the chip; and the two laser diode electrodes being positioned in any combination on one or more of a third surface of the chip, a fourth surface of the chip, a fifth surface of the chip, or a sixth surface of the chip.

2. The process of claim 1, wherein:

the seed layer is deposited by sputtering, atomic layer deposition, ion beam deposition, or combinations thereof; and metal containing material is deposited by plating, sputtering, vacuum evaporation, ion beam deposition, or combinations thereof.

3. The process of claim 2, wherein the seed layer is deposited by ion beam deposition.

4. The process of claim 1, wherein the seed layer comprises copper, gold, chromium, titanium, nickel, ruthenium, rhodium, iridium, palladium, platinum, or combinations thereof.

5. The process of claim 1, wherein forming the trench in the substrate comprises forming a single trench.

6. The process of claim 1, wherein forming the trench in the substrate comprises forming a first trench and a second trench, the first trench for disposing a first laser diode electrode of the two laser diode electrodes therein, the second trench for disposing a second laser diode electrode of the two laser diode electrodes therein.

7. The process of claim 1, wherein the substrate comprises Ga, As, Al, In, or combinations thereof.

8. The process of claim 1, wherein the substrate is selected from the group consisting of GaAs, AlAs, AlGaAs, InGaAs, InGaAsN, GaAsN, GaAsP, InP, and InGaAsP.

9. The process of claim 1, wherein at least a portion of the trench remains after forming the two laser diode electrodes in the trench.

10. A process for forming a vertical cavity surface emitting laser (VCSEL) device, comprising:

etching one or more trenches in a first surface of a substrate, each trench comprising a first surface, a second surface parallel to the first surface, and a third surface perpendicular to the first and second surfaces of the trench, the third surface of the trench connecting the first and second surfaces of the trench;

forming two laser diode electrodes in the one or more trenches, wherein forming the two laser diode electrodes in the one or more trenches comprises:

depositing a seed layer comprising a conductive material on the substrate, the seed layer being disposed on the first, second, and third surfaces of each trench;

patterning a photoresist material on the seed layer, wherein the photoresist material is disposed within at least a portion of each of the one or more trenches; and depositing a metal containing material on at least a portion of the seed layer that is free of the photoresist material, the metal containing material being disposed over the first, second, and third surfaces of each trench, and over a portion of the first surface of the substrate adjacent to the first and second surfaces of the trench;

after forming the two laser diode electrodes, cutting the substrate along the one or more trenches to form a VCSEL, the VCSEL comprising:

a chip for mounting on a slider, the chip having six surfaces, wherein:

a first surface of the chip is for facing the slider;

a second surface of the chip is opposite the first surface of the chip; and the two laser diode electrodes being positioned in any combination on one or more of a third surface of the chip, a fourth surface of the chip, a fifth surface of the chip, or a sixth surface of the chip.

11. The process of claim 10, wherein etching the one or more trenches in the substrate comprises:

etching a first trench of the one or more trenches; and etching a second trench of the one or more trenches.

12. The process of claim 11, wherein:

at least a portion of a first laser diode electrode of the two laser diode electrodes is positioned in the first trench; and at least a portion of a second laser diode electrode of the two laser diode electrodes is positioned in the second trench.

13. The process of claim 11, wherein etching the first trench, etching the second trench or both comprises performing a reactive ion etch with a chlorine containing material.

14. The process of claim 10, wherein forming the two laser diode electrodes in the one or more trenches comprises:

depositing a seed layer comprising a conductive material on the substrate; and depositing a metal containing material on at least a portion of the seed layer.

15. A process for forming a vertical cavity surface emitting laser (VCSEL) device, comprising:

etching one or more trenches formed therein in a first surface of a substrate, each of the one or more trenches comprising a first surface, a second surface parallel to the first surface of the trench, and a third surface perpendicular to the first and second surfaces of the trench, the third surface connecting the first and second surfaces of the trench;

depositing a seed layer comprising a conductive material on the substrate, the seed layer being disposed on the first, second, and third surfaces of each of the one or more trenches;

patterning a photoresist material on the seed layer, wherein the photoresist material is disposed within at least a portion of each of the one or more trenches;

depositing a metal containing material on at least a portion of the seed layer that is free of the photoresist material, the metal containing material being disposed over the first, second, and third surfaces of each of the one or more trenches, and over a portion of the first surface of the substrate adjacent to the first and second surfaces of the trench;

removing the photoresist material and a portion of the seed layer from the substrate; and cutting the substrate along the one or more trenches of the substrate after removing the photoresist material and the portion of the seed layer to form a VCSEL, the VCSEL comprising:

a chip for mounting on a slider, the chip having six surfaces, wherein:

a first surface of the chip is for facing the slider;

a second surface of the chip is opposite the first surface of the chip; and two laser diode electrodes being positioned in any combination on one or more of a third surface of the chip, a fourth surface of the chip, a fifth surface of the chip, or a sixth surface of the chip, the two laser diode electrodes formed from the seed layer and the metal containing material.

16. The process of claim 15, wherein the one or more trenches is at least two trenches, and wherein the at least two trenches have different depths.

17. The process of claim 15, wherein the seed layer is deposited by ion beam deposition.

18. The process of claim 15, wherein the seed layer comprises copper, gold, chromium, titanium, nickel, ruthenium, rhodium, iridium, palladium, platinum, or combinations thereof.

19. The process of claim 15, further comprising depositing a resist coating on the substrate, the seed layer, the metal containing material, or combinations thereof before dicing the substrate and after removing the photoresist material and the portion of the seed layer.

20. The process of claim 15, wherein an insulating layer is deposited over at least a portion of the substrate prior to depositing the seed layer.

* * * * *